United States Patent [19]
Eom et al.

[11] Patent Number: 5,810,930
[45] Date of Patent: Sep. 22, 1998

[54] PHOTO-CHEMICAL VAPOR DEPOSITION APPARATUS HAVING EXCHANGE APPARATUS OF OPTICAL WINDOW AND METHOD OF EXCHANGING OPTICAL WINDOW THEREWITH

[75] Inventors: Young Chang Eom, Dunsan-Dong; In Ho Hwang, Panam-Dong; Koeng Su Lim, Eoeun-Dong; Chang Hyun Lee, Munhyun-Dong, all of Rep. of Korea

[73] Assignee: Korea Electric Power Corporation, Seoul, Rep. of Korea

[21] Appl. No.: 613,617

[22] Filed: Mar. 11, 1996

[30] Foreign Application Priority Data

Feb. 6, 1996 [KR] Rep. of Korea .................... 1996 2822

[51] Int. Cl.[6] .................................................. C23C 16/00
[52] U.S. Cl. .......................... 118/719; 118/715; 118/722; 414/221
[58] Field of Search .................................. 118/719, 715, 118/722; 414/221

[56] References Cited

U.S. PATENT DOCUMENTS 4,836,140  6/1989  Koji ........................................ 118/719

FOREIGN PATENT DOCUMENTS 60-52014  3/1985  Japan ..................................... 118/730

Primary Examiner—Richard Bueker
Attorney, Agent, or Firm—Watson Cole Stevens Davis, P.L.L.C.

[57] ABSTRACT

A photo-chemical vapor deposition ("photo-CVD") apparatus has exchange apparatus of optical window and method of exchanging optical window therewith. There photo-CVD apparatus has exchange apparatus of optical window which can replace an optical window blurred by attachment of materials produced by dissociation of reaction gas or materials used for disposition in a reaction chamber of a photo-CVD apparatus during photo-CVD reaction with a clean optical window without exposing the inside of the reaction chamber to the air and to the method of exchanging optical window of the photo-CVD apparatus using the exchange apparatus of optical window.

12 Claims, 11 Drawing Sheets

FIG. 5a
FIG. 5b
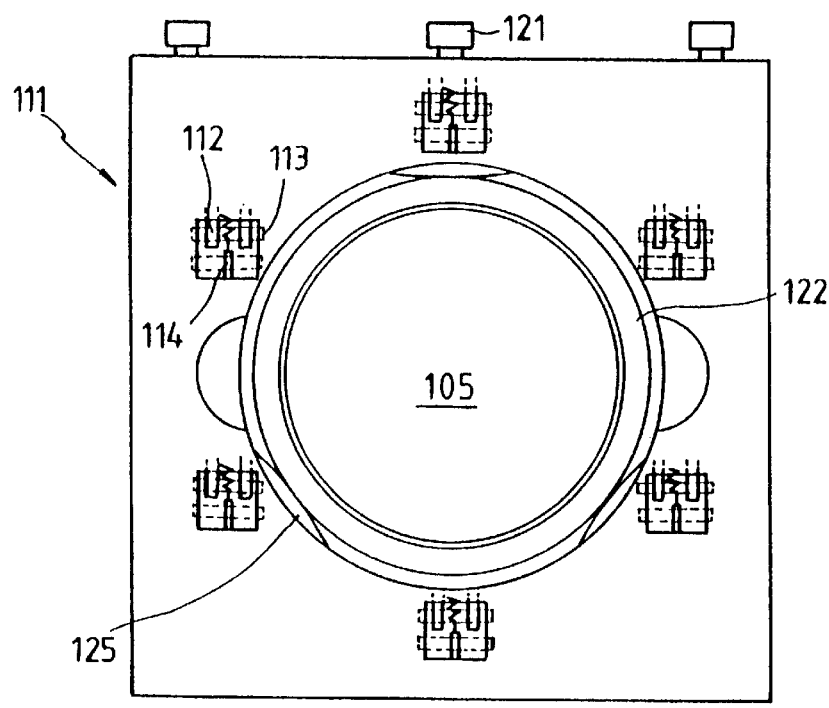
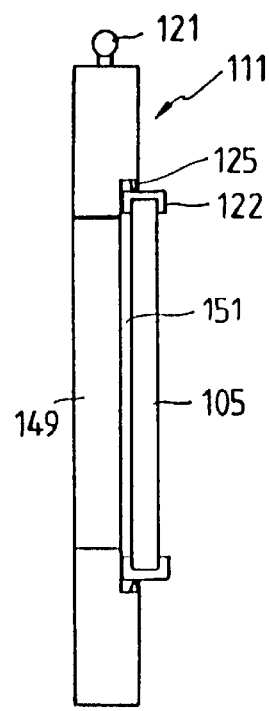

PHOTO-CHEMICAL VAPOR DEPOSITION APPARATUS HAVING EXCHANGE APPARATUS OF OPTICAL WINDOW AND METHOD OF EXCHANGING OPTICAL WINDOW THEREWITH

BACKGROUND OF THE INVENTION

A. Field of the Invention

The present invention relates to a photo-chemical vapor deposition apparatus (Hereinafter referred as "photo-CVD apparatus") having exchange apparatus of optical window and method of exchanging optical window therewith. More particularly, the present invention relates to a photo-CVD apparatus having exchange apparatus of optical window which can replace an optical window blurred by attachment of materials produced by dissociation of reaction gas or materials used for deposition in a reaction chamber of a photo-CVD apparatus during photo-CVD reaction with a clean optical window without exposing the inside of the reaction chamber to the air and to the method of exchanging optical window of the photo-CVD apparatus using said exchange apparatus of optical window.

B. Description of the Prior Art

Conventionally, a photo-CVD apparatus is an apparatus used for carrying out vapor deposition on a surface of a substrate by heating the surface of the substrate located in a vacuum reaction chamber required for photo-chemical vapor deposition reaction or by exciting reaction gas, using ultraviolet radiation, infrared rays, visible radiation or a high-energy photon emitted from an laser generation source with coherent phase. The photo-CVD apparatus comprises a reaction chamber having a gas inlet and a gas outlet, a light emitting source positioned at an upper part of the reaction chamber, a heater and a heater holder for heating a semiconductor substrate in the reaction chamber, an optical window attached to the upper part of the reaction chamber which is made of synthetic quartz and so on, to make light emitted from the light source incident into the reaction chamber and at the same time to make the reaction chamber airtight, and a vacuum exhausting means such as a vacuum pump for exhausting the air and making the reaction chamber high vacuum.

In the conventional photo-CVD apparatus, however, reaction products produced by photo-CVD reaction and reaction gas used for the deposition during the deposition of a thin film are attached to the optical window positioned between the light source and the substrate in the reaction chamber as well as to the inner wall of the reaction chamber, whereby the optical window is blurred. As a result, optical transmittance into the reaction chamber for the optical window becomes lower, thereby the efficiency of the deposition reaction becomes lower and the result of the deposition reaction is not good when the deposition reaction is repeatedly carried out; therefore, the conventional photo-CVD apparatus has a disadvantage in that a photo-CVD process can not be repeatedly performed without cleaning the optical window.

Accordingly, in order to overcome the above-mentioned disadvantage, various approaches have been made to develop a photo-CVD apparatus having a cleaning device for cleaning the optical window blurred from the deposition reaction, and the prior arts related to those approaches are as follows.

Japanese Patent Application Laid-Open No. 62-190833A has proposed a photo-CVD apparatus which utilizes plasma etching to clean the optical window. FIG. 1 is a schematic view illustrating a construction of a conventional photo-CVD apparatus using plasma etching to clean an optical window. Referring to FIG. 1, in the photo-CVD apparatus, a reaction chamber is generally divided into a reaction chamber 1 and a light introducing chamber 11 by disposing a gate valve 7 in the center of the reaction chamber having a gas inlet 5, a gas outlet 6, a heater 4 and a heater holder 3. An optical window 12 is attached to an upper most part of the light introducing chamber 11, and another gas inlet 8 and an gas outlet 9 are formed at both sides of the reaction chamber respectively. In addition, a plurality of electrodes 10 are formed in the light introducing chamber 11.

In the aforementioned photo-CVD apparatus, when the optical window is blurred during the photo-CVD process, the reaction chamber 1 are separated from the light introducing chamber 11 by closing the gate valve 7, and etching gas such as $NF_4$ is introduced into the light introduction chamber 11, after which high frequency voltage is applied to the plasma electrode 10, thereby plasma is generated, and a film of reaction products adhered to the optical window and an inner wall of the light introducing chamber 11 which is produced by the deposition reaction and the reaction gas is etched to make the optical window 12 clean. After the cleaning of the optical window 12 have been finished, the light introducing chamber 11 is made into high vacuum condition by exhausting the gas in the light introducing chamber 11 through the gas outlet 9. Thereafter, the gate valve 7 is opened and the photo-CVD process is carried out again.

Since the above-mentioned photo-CVD apparatus can clean the optical window without disassembling the optical window from the photo-CVD apparatus, that is, exposing the inside of the reaction chamber to the air, the conventional photo-CVD apparatus has an advantage in that the reaction chamber can be maintained in high purity state semipermanently by isolating the reaction chamber from pollutants such as oxygen and nitrogen in the air, water and so on, thereby the operation efficiency of the photo-CVD apparatus may be improved.

However, the photo-CVD apparatus of the prior art has the disadvantages in that the reaction chamber may be contaminated by the etching gas used for plasma etching, and the optical window should be formed thick to endure pressure difference between the inside and the outside of the reaction chamber which is maintained in high vacuum state since one side of the optical window is exposed to the air while the other side of it is positioned in the high vacuum reaction chamber. Moreover, generally, since the optical window with large diameter should be used in a photo-CVD apparatus when forming a thin film with larger diameter, which results the optical window to become thicker, in case of forming a thin film with larger diameter with the conventional photo-CVD apparatus, the absorption loss of energy of light emitted from the light source by the optical window increases. As a result, the above-mentioned photo-CVD apparatus has a limitation in that they can not be used in an effective manner for the thin film deposition of large-area substrate.

Further, Japanese Patent Application Laid-open No. 63-77111A has disclosed a photo-CVD apparatus which can prevent an optical window from being blurred using an inert gas. In the above-mentioned photo-CVD apparatus, the optical window is attached to an upper part of a reaction chamber having an inlet, an outlet, a heater and a heater holder, and in an upper side end of the reaction chamber is formed means for introducing the inert gas onto the inner side of the optical window in parallel with light incident through the optical window to preventing the optical window from being blurred.

However, the aforementioned apparatus has a problem that the flow of the reaction gas may be affected by the flow of the inert gas during the deposition process, which may result in bad influences on the thin film deposition process, and that it is impossible to carry out continuous deposition processes due to the blurred optical window because the adherence of reaction products and the reaction gas to the optical window can not be effectively prevented.

Furthermore, Japanese Patent Application Laid-open No. 62-266822A has revealed a photo-CVD apparatus having exchange apparatus of an optical window which can replace the blurred the optical window mechanically with a clean one. FIG. 2 is a schematic view illustrating a construction of a conventional photo-CVD apparatus having exchange apparatus of optical window which can replace a blurred optical window into a new one using a roller. As can be seen from FIG. 2, in the above-mentioned photo-CVD apparatus, an opening 32 is formed in an uppermost part of a reaction chamber 21 having a gas inlet 25, a gas outlet 26, a heater 22 and a heater holder 24, and a lid 29 which is at least twice as large as the opening 32 of the reaction chamber 21 and at the center of which the optical window 28 is attached is formed to be moved left and right onto the rollers 30 located at the outside of the reaction chamber 21. The lid 29 and the reaction chamber 21 are sealed tightly up by an O-ring 31.

In the photo-CVD apparatus, the deposition process is carried out by placing a substrate 23 on the heater holder 24, irradiating light from a light source 27. When reaction products and reaction gas are attached to the optical window 28, thereby blurring the optical window 28, the lid 29 to which the optical window 28 is attached is moved to the right and one half of the optical window 28 is cleaned, and again the lid 29 is moved to the left and the other half of the optical window 28 is cleaned. Thereafter, the optical window 28 returns back to an original position and the deposition process is performed again.

Yet, the above-mentioned photo-CVD apparatus has a drawback in that dust can be generated by friction among the rollers 30, the O-ring 31 and the optical window 28 and the optical window 28 can be polluted or scratched because the lid 29 being moved to the left and the right onto the rollers 30. In addition, it is difficult not only to maintain the vacuum state of the reaction chamber 21 since the reaction gas can be leaked out from the reaction chamber 21 owing to the friction among the rollers 30, the O-ring 31 and the optical window 28, but to manufacture the photo-CVD apparatus which is capable of deposition of the thin film with large area since one surface of the optical window 28 is exposed to the air.

SUMMARY OF THE INVENTION

With the forgoing in view, the present invention is intended to overcome various problems and disadvantages of the photo-CVD apparatus of the prior art. and therefore the primary object of the present invention is to provide a photo-CVD apparatus having exchange apparatus of optical window giving various advantages in that an optical window blurred by adherence of reaction products and reaction gas during a deposition process by the photo-CVD apparatus can be replaced with a clean optical window in a mechanical manner without exposing the inside of a reaction chamber to the air semipermanently and it is possible to maintain the clean state of the reaction chamber since dust can not be generated, to maintain the vacuum sealing state between the optical window and the reaction chamber efficiently, to prevent the pollution of the reaction chamber resulted from additional etching gas and to prevent bad influence on the reaction chamber by the reaction gas, and to be utilized in an efficient manner to deposit a thin film on the substrate with large surface area.

Another object of the present invention is to provide a method of exchanging optical window by which the optical window blurred by the adherence of reaction products and the reaction gas during the deposition process by the photo-CVD apparatus can be simply replaced with the clean optical window without exposing the inside the reaction chamber to the air semipermanently using the exchange apparatus of the present invention.

According to one aspect of the present invention, for achieving the above objects, there is provided a photo-CVD apparatus having exchange apparatus of optical window comprising:

a reaction chamber for carrying out a deposition reaction having a gas inlet, a gas outlet, a substrate heating holder, heater, and an optical port being formed thereon;

an optical window fixing chamber for being carried out detachment/attachment of an optical window transferred by an optical window transferring means, being formed on an upper part of said reaction chamber, having a gas inlet and a gas outlet and a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a door at the lower end thereof for replacing the optical window;

an opening and shutting means for communicating said optical window fixing chamber with said optical window exchange chamber or separating said optical window fixing chamber from said optical window exchange chamber, said opening and shutting means being located between said optical window fixing chamber and said optical window exchange chamber;

an optical window transferring means, into which the optical window is mounted, for transferring the optical window by traversing between said optical window exchange chamber and said optical window fixing chamber, and for detaching/attaching the optical window on said optical port of said reaction chamber; and a driving means for providing driving force to make said optical window transferring means traverse between said optical window exchange chamber and said optical window fixing chamber, said driving means being connected to said optical window transferring means.

At this time, in order to place said light source in the same circumstance with said optical window fixing chamber, it is preferable that a light source chamber communicating with said optical window fixing chamber and having a light source therein is additionally provided onto an upper part of said light passing port of said optical window fixing chamber.

Further, said optical window transferring means includes:

a gate plate having a light passing passage formed in the center thereof for passing a light emitted from the light source, said gate plate having a fixing means for fixing the optical window, and said gate plate having a gate plate horizontal position fixing means for fixing horizontal position of the gate plate by contacting one side wall of said optical window fixing chamber;

an optical window carriage for transferring said gate plate transversely between the optical window exchange chamber and the optical window fixing chamber, said carriage being connected to said driving means and located at an upper part of said gate plate, having a light passing passage in the center thereof for passing the light emitted from the light source, having a plurality of carriage wheels attached to both sides thereof; and a gate plate pressing means for pressing the optical window fixed to said gate plate onto the outer peripheral edge of said optical port in the reaction chamber or separating the optical window from said optical port in said reaction chamber by lifting off or dropping said gate plate, said gate plate pressing means being connected to said gate plate and said optical window carriage.

At this time, as for the optical window fixing means of the gate plate, the optical window fixing means comprised of a circular groove for fixing the optical window, said groove being formed into a lower part of said gate plate, and a plurality of optical window fixing spring for pressing the optical window, to the edge of which a vacuum sealing means is attached, to the central axis, said fixing springs being formed to the side wall of said circular groove, may be used. Alternatively, the optical window fixing means comprising a cassette-type optical window fixing device composed of an upper plate formed of a ring shape and having a vacuum sealing means attached to the upper and the lower surfaces thereof respectively and a plurality of links mounted to the sides thereof, and a lower plate having a plurality of projections connected to said links of said upper plate, so as to receive the optical window therebetween; and a circular groove for fixing said cassette-type optical window fixing device to the gate plate, said groove being formed in the lower part of the gate plate, having a plurality of grooves for mounting the optical window fixing device so as to insert said projections of said lower plate of said optical window fixing device therein, may be used.

According to another aspect of the present invention, a photo-CVD apparatus having exchange apparatus of optical window comprises:

a reaction chamber for carrying out a deposition reaction, having a gas inlet, a gas outlet, a substrate heating holder, a heater, and an optical port being formed thereon;

an optical window fixing chamber for being carried out detachment/attachment of an optical window transferred by an optical window transferring means, being formed on an upper part of said reaction chamber, having a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a optical window exchange port at the lower end thereof for replacing the optical window;

an optical window load-lock chamber being formed to communicate with said optical window exchange chamber downwardly via said optical window exchange port of optical window exchange chamber, having a gas inlet, a gas outlet, and a door at one side thereof for replacing the optical window, and said load-lock chamber having a lower-upper conveying means of a optical window for attaching or detaching the optical window to or from the optical window transferring means;

an opening and shutting means for communication said optical window exchange chamber with said optical window load-lock chamber or separating said optical window exchange chamber from said optical window load-lock chamber, said opening and shutting means being located between said optical window exchange chamber and said optical window load-lock chamber;

an optical window transferring means, into which the optical window is mounted by said lower-upper conveying means of said optical window load-lock chamber, for transferring the optical window by traversing between said optical window exchange chamber and said optical window fixing chamber, and for detaching/attaching the optical window on said optical port of said reaction chamber; and a driving means for providing driving force to make said optical window transferring means traverse between said optical window exchange chamber and said optical window fixing chamber, said driving means being connected to said optical window transferring means.

At this time, in order to place said light source in the same circumstance with said optical window fixing chamber, it is preferable that a light source chamber communicating with said optical window fixing chamber and having a light source therein is additionally provided onto an upper part of said light passing port of said optical window fixing chamber.

According to another aspect of the present invention, a photo-CVD apparatus having exchange apparatus of optical window comprises:

a reaction chamber for carrying out a deposition reaction, having a gas inlet, a gas outlet, a substrate heating holder, heater and an optical port being formed thereon;

an optical window fixing chamber for being carried out detachment/attachment of an optical window transferred by an optical window transferring means, being formed on an upper part of said reaction chamber, having a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a optical window exchange port at the lower end thereof for replacing the optical window;

an optical window load-lock chamber being formed to communicate with said optical window exchange chamber downwardly via said optical window exchange port of optical window exchange chamber, having a gas inlet, a gas outlet, and a door at the lower end thereof for replacing the optical window;

an optical window transferring means, into which the optical window is mounted, for transferring the optical window by traversing between said optical window exchange chamber and said optical window fixing chamber, and for detaching/attaching the optical window on said optical port of said reaction chamber, said optical window transferring means including:

a gate plate having a light passing passage formed in the center thereof for passing a light emitted from the light source, said gate plate having a fixing means for fixing the optical window, and said gate plate having a gate plate horizontal position fixing means for fixing horizontal position of the gate plate by contacting a supporting means for fixing gate plate horizontal position or by contacting one side wall of said optical window fixing chamber;

an optical window carriage for transferring said gate plate transversely between said optical window exchange chamber and the optical window fixing chamber, said carriage being connected to a driving means and located at an upper part of said gate plate, having a light passing passage in the center thereof for passing the light emitted from said light source, having a plurality of carriage wheels attached to both sides thereof; and, a gate plate pressing means for lifting off or dropping said gate plate, said gate plate pressing means being connected to said gate plate and said optical window carriage;

a driving means for providing driving force to make said optical window transferring means traverse between said optical window exchange chamber and said optical window fixing chamber, said driving means being connected to said optical window transferring means;

a storage chamber for storing a gate plate vacuum sealing means, said gate plate vacuum sealing means for vacuum-sealing said light passing port of said gate plate by the downward movement being mounted to an upper part of said storage chamber, said gate plate vacuum sealing means including a circular plate having a diameter smaller than that of said light passing port in said optical window carriage plate and larger than that of said light passing port in said gate plate and holding rod for holding said circular plate for moving said circular plate up and down, one end of said holding rod being attached to said circular plate; and a supporting meas for fixing gate plate horizontal position being formed at a lower part between said optical window fixing chamber and said optical window exchange chamber, said supporting means being provided to move downwardly and upwardly so as to support said gate plate horizontal position fixing means by contacting therewith to the movement of said driving means, when said optical window transferring means positioned at said optical window exchange chamber.

At this time, in order to place said light source in the same circumstance with said optical window fixing chamber, it is preferable that a light source chamber communicating with said optical window fixing chamber and having a light source therein is additionally provided onto an upper part of said light passing port of said optical window fixing chamber.

According to the other aspect of the present invention, there is provides a method of exchanging an optical window in photo-CVD apparatus of the invention, said method comprising the steps of:

exhausting the air of a reaction chamber, an optical window fixing chamber and an optical window exchange chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

separating said optical window fixing chamber from said optical window exchange chamber by an opening and shutting means;

maintaining said isolated optical window exchange chamber to a atmospheric pressure;

opening a door of said optical window exchange chamber and replacing said blurred optical window with a clean one;

closing said door and exhausting the air of said optical window exchange chamber to a high vacuum;

opening said opening and shutting means and transferring said clean optical window to said optical window fixing chamber by said optical window transferring means; and moving said optical window downwardly and mounting said optical window onto said reaction chamber.

Further, according to another aspect of the present invention, a method of exchanging an optical window in photo-CVD apparatus comprises the steps of:

exhausting the air of a reaction chamber, an optical window fixing chamber, an optical window exchange chamber and an optical window load-lock chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

opening an opening and shutting means and collecting said blurred optical window by lifting off an optical window lower-upper conveying means;

separating said optical window fixing chamber and said optical window exchange chamber from said optical window load-lock chamber by said opening and shutting means;

maintaining said isolated optical window load-lock chamber to a atmospheric pressure;

removing said blurred optical window after opening a door of said load-lock chamber and mounting a clean optical window on said optical window lower-upper conveying means;

closing said door and exhausting the air of said optical window load-lock chamber to a high vacuum;

opening said opening and shutting means and mounting the optical window into said optical window transferring means by lifting off said optical window lower-upper conveying means;

dropping said optical window lower-upper conveying means and closing said opening and shutting means;

transferring said clean optical window to said optical window fixing chamber by said optical window transferring means; and moving said optical window downwardly and mounting said optical window onto said reaction chamber.

Moreover, according to another aspect of the present invention, a method of exchanging an optical window in photo-CVD apparatus comprises the steps of:

exhausting the air of a reaction chamber, an optical window fixing chamber, an optical window exchange chamber, a storage chamber and an optical window load-lock chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

lifting off a supporting meas for fixing gate plate horizontal position, pushing a driving means, and adhering a gate plate of a optical window transferring means closely to the edge of an optical window exchange port of a optical window transferring means;

separating said optical window fixing chamber, said optical window exchange chamber and said storing chamber from said optical window load-lock chamber by dropping a gate plate vacuum sealing means through a light passing port formed at an optical window carriage of said optical window transferring means;

maintaining said isolated optical window load-lock chamber to a atmospheric pressure;

opening a door of said load-lock chamber and replacing a blurred optical window with a clean one;

closing said door and exhausting the air of said optical window load-lock chamber to a high vacuum;

storing said gate plate vacuum sealing means in a storage chamber by lifting off said gate plate vacuum sealing means;

returning said gate plate of said optical window transferring means to a releasing state by pulling said driving means and dropping said supporting meas for fixing gate plate horizontal position;

transferring said clean optical window to said optical window fixing chamber by said optical window transferring means; and moving said optical window downwardly and mounting said optical window onto said reaction chamber.

The photo-CVD apparatus having exchange apparatus of an optical window of the invention constructed as above has various advantages in that an optical window blurred by adherence of reaction products and reaction gas during a deposition process by the photo-CVD apparatus can be replaced with a clean optical window in a mechanical manner without exposing the inside of a reaction chamber to the air semipermanently and it is possible to maintain the clean state of the reaction chamber since dust can not be generated, to maintain the vacuum sealing state between the optical window and the reaction chamber efficiently, to prevent the pollution of the reaction chamber resulted from additional etching gas and to prevent bad influence on the reaction chamber by the reaction gas, and to be utilized in an efficient manner to deposit a thin film on the substrate with large surface area. In addition, according to the method of exchanging optical window of the invention, an optical window blurred by the adherence of reaction products and the reaction gas during the deposition process by the photo-CVD apparatus can be simply replaced with clean one without exposing the inside the reaction chamber to the air semipermanently using the exchange apparatus of the present invention.

The photo-CVD apparatus having exchange apparatus of an optical window and method of exchanging an optical window according to the preferred embodiments of the present invention will be effectively applied to replace an optical window blurred by the attachment of the materials produced by dissociation of the reaction gas in the reaction chamber or the materials used for deposition or growth with the clean optical window in a lamp-heating type thermal chemical vapor deposition apparatus which utilizes the light energy as heat source, a photo-excited etching apparatus and all the vapor deposition apparatus or growth apparatus having the optical window in a broad sense, as well as the photo-CVD apparatus.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIGS. 5A and 5B are a plan view and a side view illustrating a gate plate, to which an optical window is attached, which is one of elements of an optical window transferring means provided in the photo-CVD apparatus according to a preferred embodiment of the present invention;

DETAILED DESCRIPTION OF THE PREFERRED EMBODIMENTS

Preferred embodiments of the present invention will hereinafter be described in detail with reference to the accompanying drawings. Throughout the specification and the accompanying drawings, same numerals are given to indicate the parts which has the same and similar functions.

Figure 1:
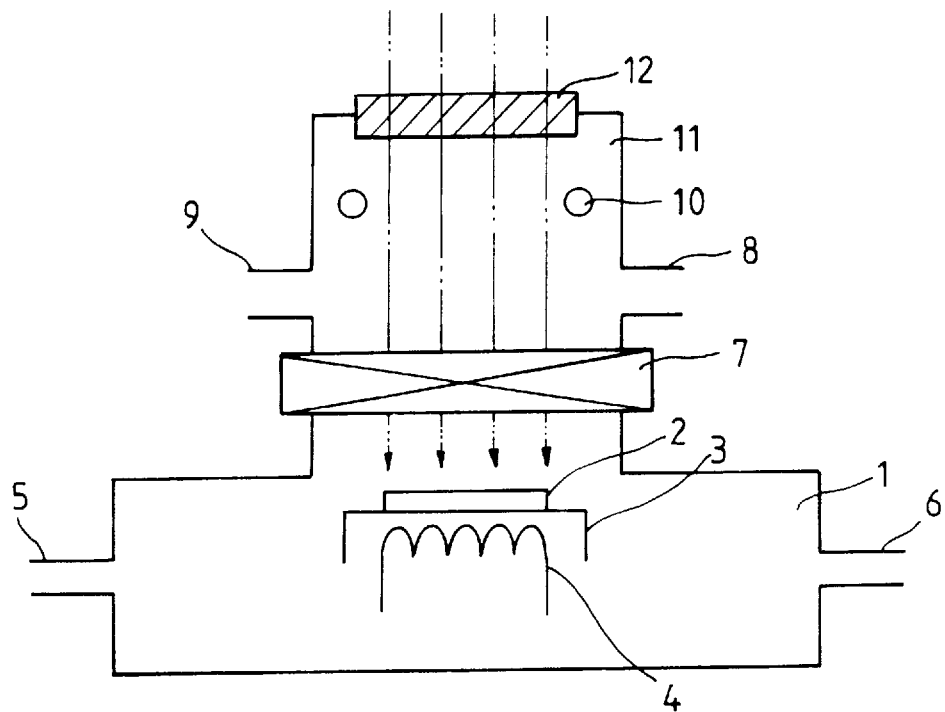
FIG. 1 is a schematic view illustrating a construction of a conventional photo-CVD apparatus using plasma etching to clean an optical window.
Figure 2:
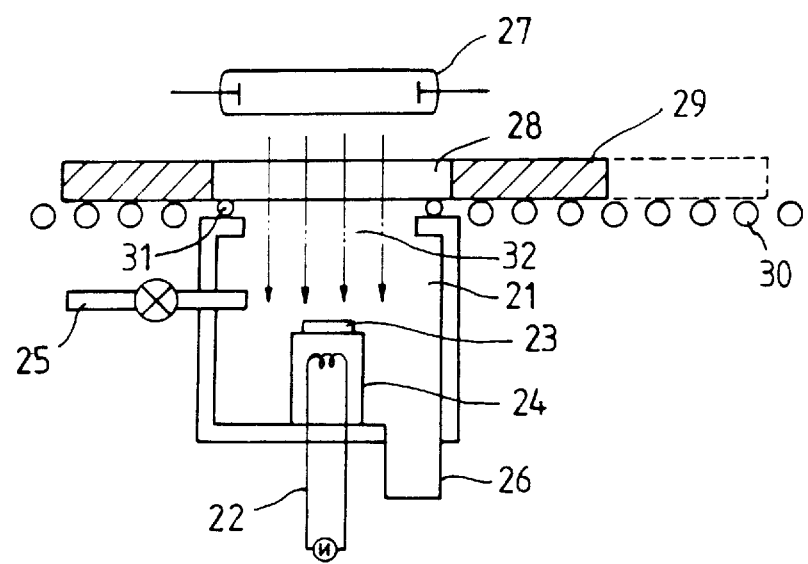
FIG. 2 is a schematic view illustrating a construction of another conventional photo-CVD apparatus having exchange apparatus of an optical window which can replace a blurred optical window into clean one using a roller.
Figure 3:
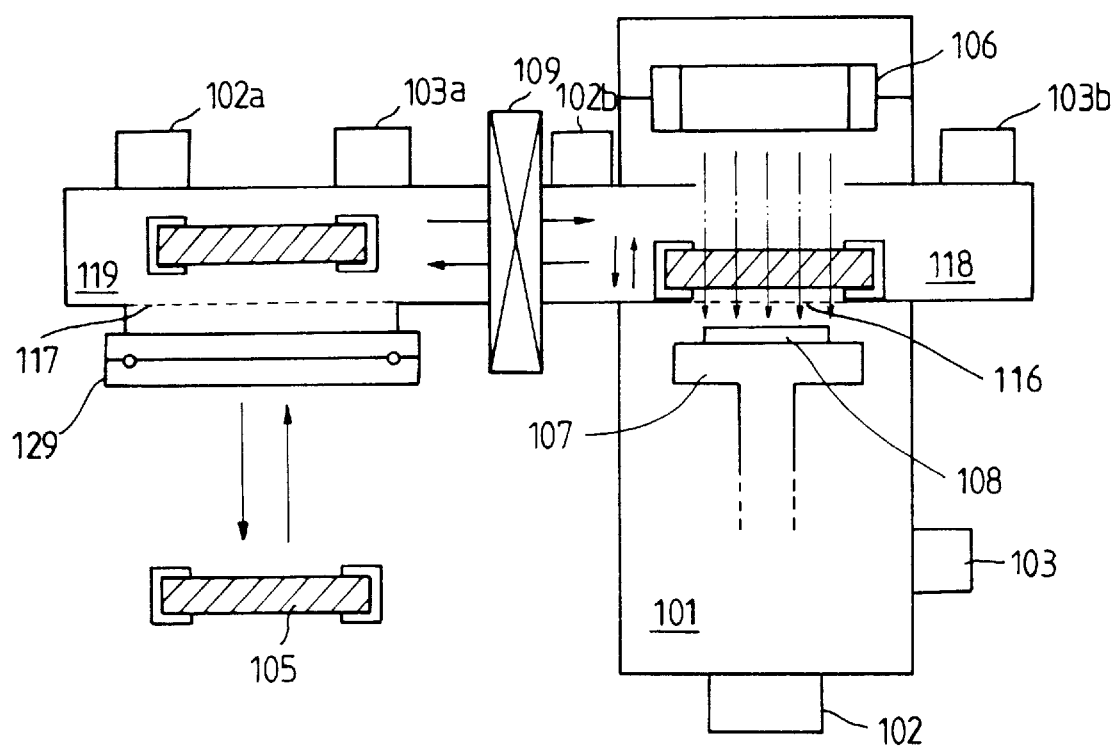
FIG. 3 is a conceptional view illustrating method of exchanging an optical window of photo-CVD apparatus according to the present invention.

FIG. 3 is a conceptional diagram illustrating a method of exchanging optical window of a photo-CVD apparatus according to the present invention. Referring to FIG. 3, in order to exchange an optical window blurred by adherence of reaction products and reaction gas during a deposition process of the photo-CVD apparatus, the air of a reaction chamber 101 having a gas inlet 103, a gas outlet 102 and a substrate heating holder 107 for heating and holding a substrate 108, an optical window exchange chamber 119 and an optical window fixing chamber 118, is exhausted through the gas outlet 102 and 102a (or 102 and 102b), thereby making them to a high vacuum state. Next, an optical window 105 which is in sealing contact on an optical port formed in the lower part of the optical fixing chamber 118 is transferred to the optical window exchange chamber 119 by an optical window transferring means (not shown). Thereafter, a gate valve 109 which is one example of an opening and shutting means is closed to separate the optical window exchange chamber 119 from the optical window fixing chamber 118. The optical window exchange chamber 119 is maintained in an atmospheric pressure, and a door 129 is opened, so as to replace a blurred optical window with a clean optical window through an optical window exchange port 117. At this time, the optical window fixing chamber 118 is completely separated from the optical window exchange chamber 119 by the gate valve 109, and the reaction chamber 101 and the optical window fixing chamber 118 are continually maintained in high vacuum.

After that, the optical window exchange chamber 119 is again exhausted by the gas outlet 102a, the gate valve 109 is opened, and the optical window 105 is transferred to the optical window fixing chamber 118 by the optical window transferring means. When the center of the optical port 116 in the reaction chamber 101 coincides with the center of the optical window 105, the optical window 105 is vertically moved down, thereby closing up the optical window 105 tightly to the optical port 116 in the reaction chamber 101.

Thereafter, a thin film is formed on the substrate 108 according to a conventional photo-CVD process while light emitted from a light source 106 is irradiated on the substrate 108. At this time, nitrogen or an inert gas is introduced into the optical window fixing chamber 118 and the optical window exchange chamber 119 through a gas inlet 103a and 103b, thereby making internal pressure in the optical window fixing chamber 118 and the optical window exchange chamber 119 the same with that of process gas in the reaction chamber 101 when the thin film is formed on the substrate 108.

According to the method of exchanging the optical window of the present invention as above, the impurities inflow into the reaction chamber 101 can be prevented since the optical window 105 is replaced with the clean optical window in a mechanical manner without breaking the vacuum state of the reaction chamber 101 during the process of exchanging the optical window 105, whereby the reaction chamber 101 is not exposed to the air semi-permanently, and operation efficiency of the photo-CVD apparatus is improved because the successive photo-CVD process is possible, thereby advancing the date of practical use of the photo-CVD process. Moreover, it is possible to manufacture a large photo-CVD apparatus which can perform the deposition process of a large thin film since it is possible to remove the difference of pressure added to internal and external surfaces of the optical window 105 closed up tight to the upper part of the reaction chamber 101 by introducing the nitrogen or the inert gas into the optical window fixing chamber 118 and the optical window exchange chamber 119 through the gas outlet 103a and 103b when the thin film is formed on the substrate 108, thereby using the thin optical window unlike the conventional photo-CVD apparatus, and as a result, it is possible to decrease light absorption by the optical window 105.

Figure 4:
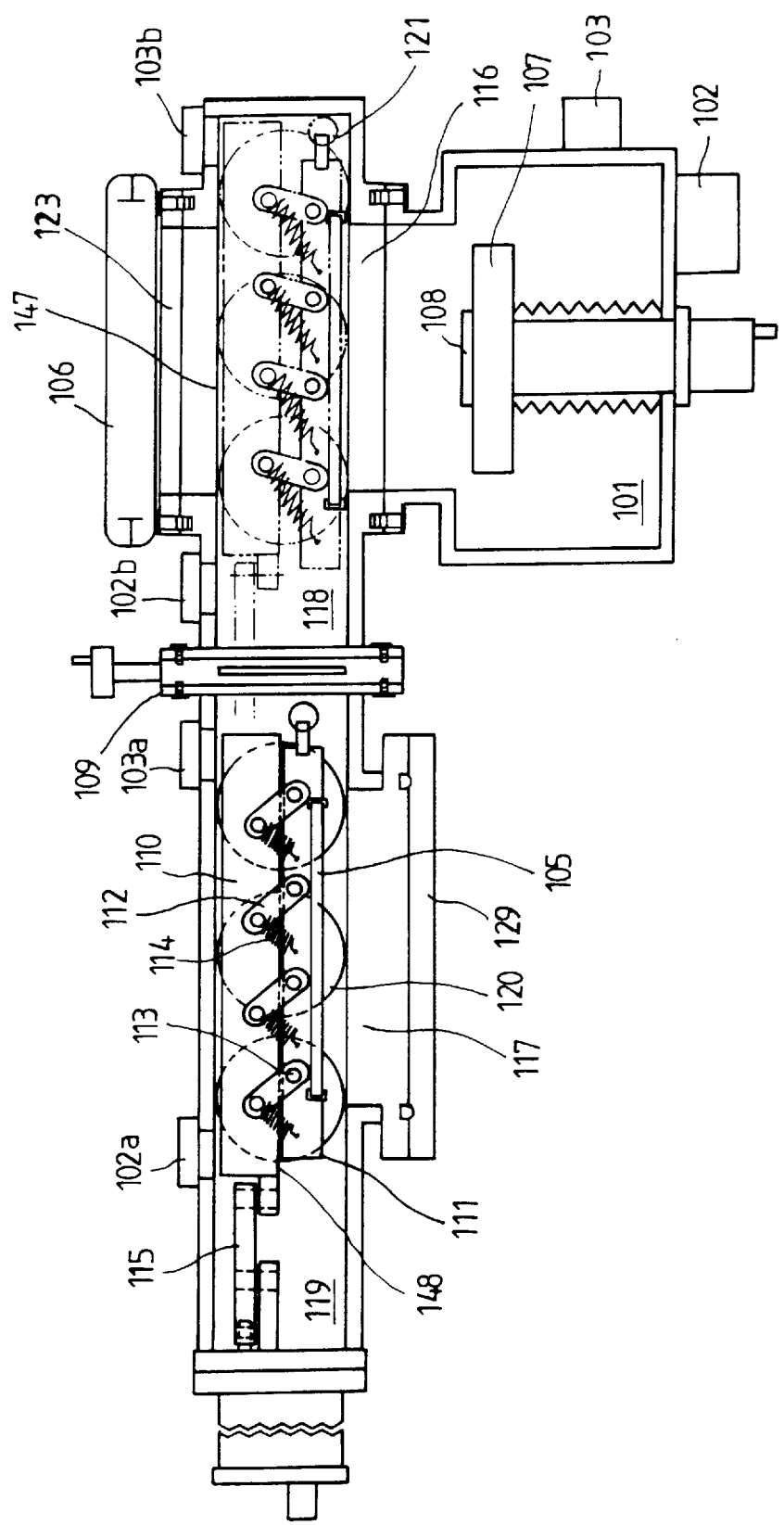
FIG. 4 is a sectional view illustrating a photo-CVD apparatus having exchange apparatus of an optical window according to one preferred embodiment of the present invention.

FIG. 4 is a sectional view illustrating a photo-CVD apparatus having exchange apparatus of optical window according to a preferred embodiment of the present invention. Referring to FIG. 4, the photo-CVD apparatus having exchange apparatus o the invention comprises a reaction chamber 101 having a gas inlet 103, a gas outlet 102, a substrate heating holder 107 and heater (not shown), on which an optical port 116 is formed, and for carrying out a deposition reaction; an optical window fixing chamber 118 formed on an upper part of the reaction chamber 101, having a gas inlet 103b and an outlet 102b, and a light passing port 147 in an upper part of the optical window fixing chamber 118, and for carrying out detachment/attachment of an optical window 105 transferred by an optical window transferring means 148 having a gate plate 111, an optical window carriage 110, and, a link pin 113, a gate plate link 112 and a carriage spring 114 which is a gate plate pressing means,; a light source 106 for irradiating light having a required energy for photo-CVD reaction into the reaction chamber 101 through a viewport 123 mounted on the light passing port 147 in the optical window fixing chamber 118; an optical window exchange chamber 119 transversely integrally extended from the optical window fixing chamber 118, having a door 129 for replacing the optical window in a lower part of an inlet 103a and an outlet 102a, and for replacing the blurred optical window transferred by the optical window transferring means 148 with clean one; an opening and shutting means such as a rectangular gate valve 109 disposed between the optical window fixing chamber 118 and the optical window exchange chamber 119, and for communicating or separating the optical window fixing chamber 118 and the optical window exchange chamber 119; an optical window transferring means 148 to which the optical window 105 is attached, transferring the optical window 105 while traversing between the optical window exchange chamber 118 and the optical window fixing chamber 119, and for detaching/attaching the optical window 105 on the optical port 116 of the reaction chamber 101; and, a stem 115, which is one of the examples of a driving means, for providing driving force to make the optical window transferring means 148 traverse between the optical window exchange chamber 119 and the optical window fixing chamber 118, said stem 115 being in connected to said optical window transferring means 148.

Figure 6A:
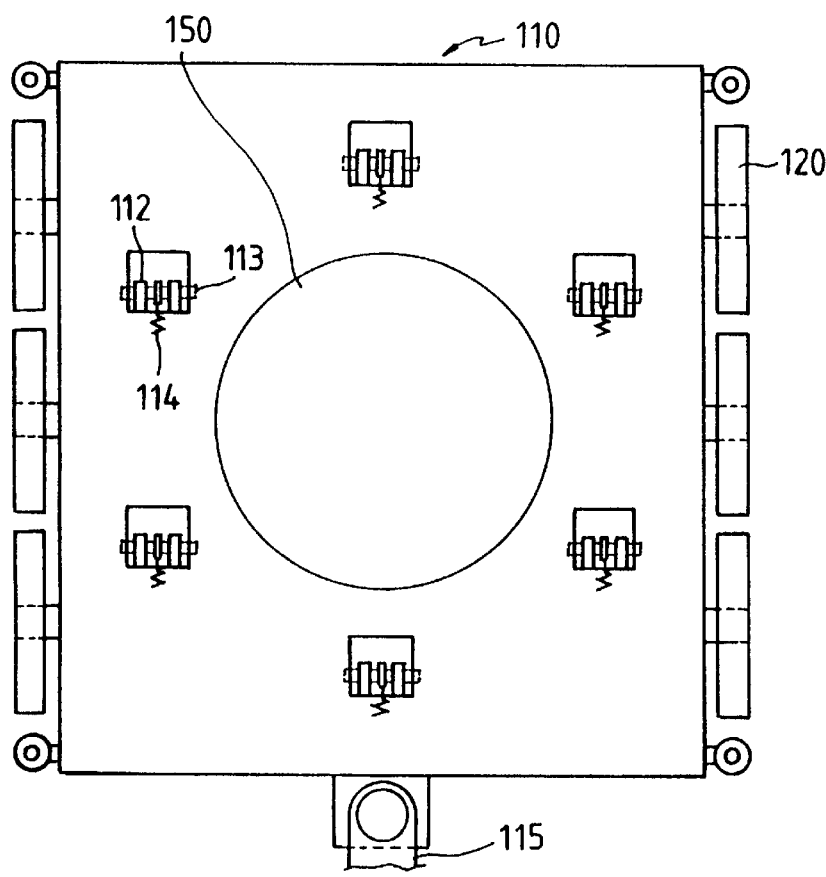
FIGS. 6A and 6B are a plan view and a side view respectively illustrating an optical window carriage which is one of elements of an optical window transferring means provided in the photo-CVD apparatus according to a preferred embodiment of the present invention.
Figure 6B:
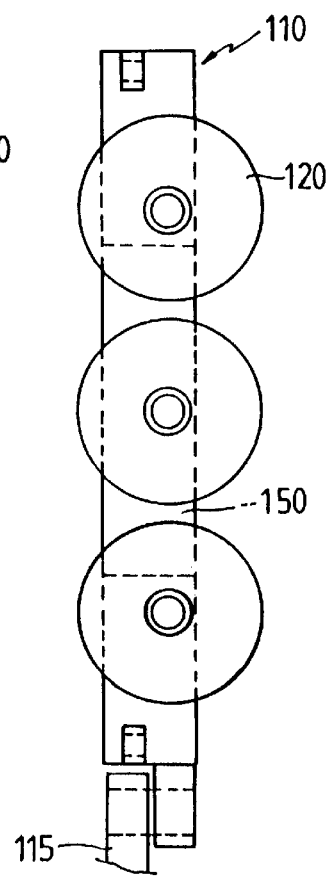

FIGS. 5A and 5B are a plan view and a side view illustrating a gate plate which is one of the elements of an optical window transferring means 148 provided in the photo-CVD apparatus of the present invention and to which an optical window 105 is attached. And, FIGS. 6A and 6B are a plan view and a side view respectively illustrating an optical window carriage 110 which is one of the elements of an optical window transferring means 148 provided in the photo-CVD apparatus.

Referring to FIGS. 4 to 6, the optical window transferring means 148 includes a gate plate 111 having a light passing passage 149 for passing the light emitted from the light source 106 and formed in the center of the gate plate 111, a spring 125 for fixing the optical window 105, and a gate plate horizontal position fixing bearing 121, which is a means for fixing horizontal position of the gate plate 111 by contacting one side wall of the optical window fixing chamber 118; an optical window carriage 110 formed in an upper part of the gate plate 111, having a light passing passage 150 for passing the light emitted from the light source 106 and formed in the center of the optical window carriage 110, carriage wheels 120 formed in both sides of the optical window carriage 110, and connected to the stem 115, thereby making the gate plate 111 traverse between the optical window exchange chamber 119 and the optical window fixing chamber 118; and a gate plate pressing means having gate link 112, a link pin 113 and a carriage spring 114 connected to the gate plate 111 and the optical window carriage 110 and for pressing the optical window 105 fixed to the gate plate 111 to the optical port 116 in the reaction chamber 101 or separating the optical window 105 fixed to the gate plate 111 from the optical port 116 in the reaction chamber 101 by lifting off or dropping the gate plate 111.

Now, the operation of the photo-CVD apparatus having exchange apparatus of an optical window according to a preferred embodiment of the present invention will be described in detail.

After a photo-CVD process is finished, the reaction chamber 101 is sufficiently purged by nitrogen or an inert gas and the air of the reaction chamber 101 is exhausted to a high vacuum, in order to replace the optical window 105 blurred by the adherence of reaction products or reaction gas, when the stem 115 connected to the optical window carriage 110 is pulled to the left in the drawing, the optical window carriage 110 and the gate plate 111 connected to the optical window carriage 110 is transferred from the optical window fixing chamber 118 to the optical window exchange chamber 119. After the optical window transferring means 148 is moved to the optical window exchange chamber 119, the gate valve 109 is closed, thereby separating the optical window fixing chamber 118 and the reaction chamber 101 from the optical window exchange chamber 119. At this time, the optical window exchange chamber 119, the optical window fixing chamber 118 and the reaction chamber 101 are maintained in high vacuum.

The nitrogen and the inert purge gas flows through a gas inlet 103a into the optical window exchange chamber 119, and only the optical window exchange chamber 119 is maintained in an atmospheric pressure. The door 129 is opened, the blurred optical window 105 mounted in a predetermined circular groove 151 is removed through the optical window exchange port 117, and the clean optical window 105 is mounted inside the circular groove 151 in the gate plate 111.

As can be seen from FIGS. 5A and 5B, in order to fix an optical window 105 in a gate plate 111, the circular groove 151 for fixing the optical window 105 is formed in a lower part of the gate plate 111, and a spring 125 for pressing the optical window 105 having an O-ring 122, which is a vacuum sealing means, in a border thereof to the central direction, is formed on a wall of the circular groove 151. Accordingly, the optical window 105 is mounted in the circular groove 151 of the gate plate 111 after an extra space in which the optical window 105 can be inserted is formed by pushing the spring 125 formed in the wall of the circular groove 151 in the gate plate 111 to the outside of the circular groove 151 when the optical window 105 is mounted in the gate plate 111. At this time, the blurred optical window 105 removed from the gate plate 111 is cleaned using an organic solvent and so on in the outside of the photo-CVD apparatus in a separate way.

After mounting the clean optical window 105 in the gate plate 111, the air is exhausted by opening the outlet 1021. The air of the optical window exchange chamber 119 is exhausted, thereby making the optical window exchange chamber 119 to a high vacuum after cleaning the optical window exchange chamber 119 sufficiently by repeating inhalation and exhausting process three to five times again. Thereafter, the gate valve 109 is opened, the optical window carriage 110 attached to the gate plate 111 is transferred to the optical window fixing chamber 118 using the stem 115. The gate plate 111 is moved until the optical window 105 fixed to the gate plate 111 reaches the optical port 116 in the reaction chamber 101.

Figure 7A:
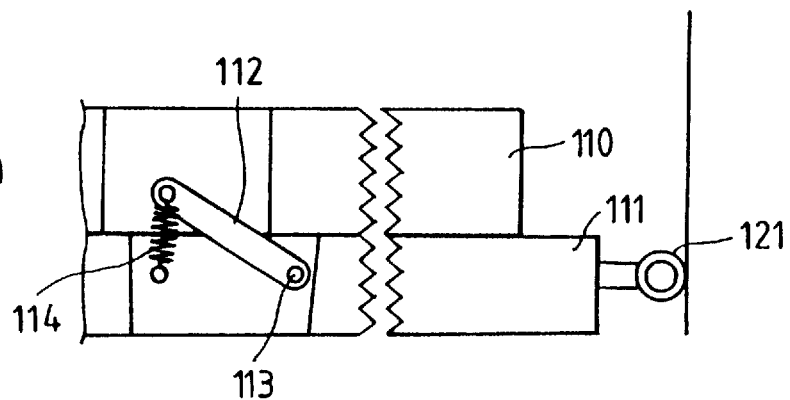
FIGS. 7A to 7C are views illustrating lifting and dropping operations of a gate plate in an optical window transferring means provided in the photo-CVD apparatus according to a preferred embodiment of the present invention.
Figure 7B:
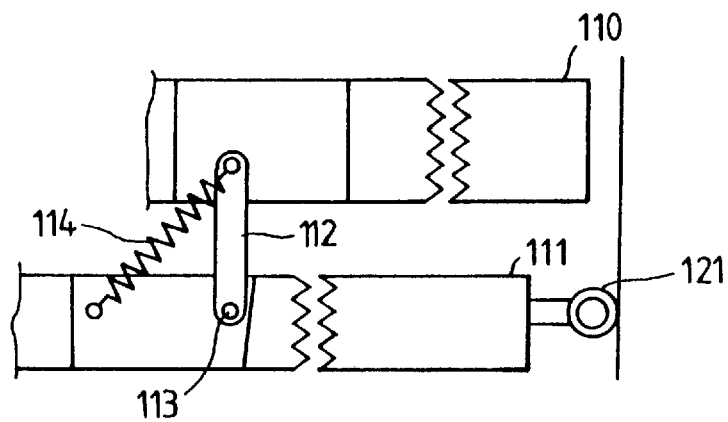
Figure 7C:
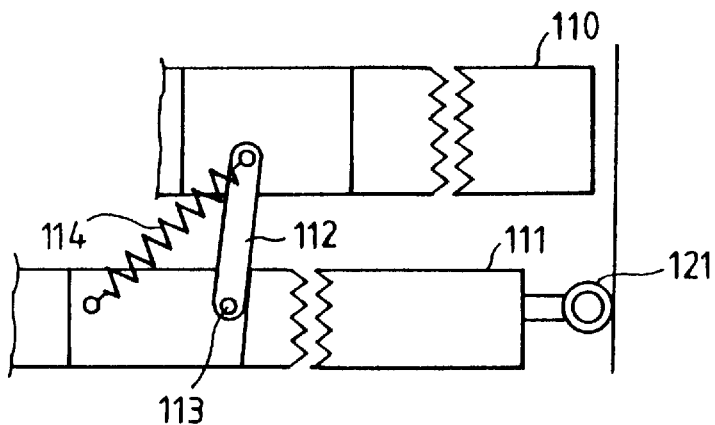

FIGS. 7A to 7C are schematic views illustrating lifting and dropping operations of a gate plate 111 in an optical window transferring means provided in the photo-CVD apparatus according to a preferred embodiment of the present invention. Referring to FIGS. 7A to 7C, when the optical window carriage 110 in the optical window transferring means 148 which has reached on the optical port 116 in the reaction chamber 101 is continuously pushed by the stem 115, the bearing 121 which is formed in one side of the gate plate 111 and is the horizontal position fixing means contacts one wall of the optical window fixing chamber 118, thereby fixing the horizontal position of the gate plate 111. At this time, if the optical window carriage 110 is continuously pushed as illustrated in FIG. 7A, the gate link 112 between the optical window carriage 110 and the gate plate 111 rotates, centering on the link pin 113, thereby dropping the gate plate 111 downwardly, and the optical window carriage 10 and the gate plate 111 are separated each other as illustrated in FIG. 7B.

Since the optical window carriage 110 pushes the wall of the optical window fixing chamber 118 with a maximum force when the gate link 112 is vertical to the gate plate 111, the O-ring 122 formed in the optical window 105 fixed to the gate plate 111 and having a section of C-shape press the periphery of the optical port 116 in the reaction chamber 101 with the maximum force, thereby making closing degree of the reaction chamber 101 high, however, it is easy for the gate plate 111 to return to the original position by restoring force of the stretched carriage spring 114 in this state as illustrated in FIG. 7A.

Accordingly, as illustrated in FIG. 7B, in case the optical window carriage 110 is pushed to the right a little more when the gate link 112 is vertical to the gate plate 111, the gate link 112 is fixed to a position of locking state as illustrated in FIG. 7C. In this state, the stretched spring 114 adds the restoring force to the gate link 112, but if the carriage spring 114 having suitable elastic coefficient is used for the gate link 112 not to return to the state illustrated FIG. 7A after passing through the state illustrated in FIG. 7B, the gate link 112 maintains the state illustrated in FIG. 7C, that is, the locking state continually.

As described above, when the optical window 105 fixed to the gate plate 111 is pressed to the optical port 116 in the reaction chamber 101, the nitrogen or the inert gas flows into the optical window exchange chamber 119 and the optical window fixing chamber 118, the reaction gas for the photo-CVD process flows into the reaction chamber 101, and a thin film is formed on a substrate 108 by the photo-CVD process, irradiating light from the light source 106 to the substrate 108 on the substrate heating holder 107.0

Thereafter, when the optical window is blurred by the photo-CVD process, the air of the reaction chamber 101, the optical window fixing chamber 118 and the optical window exchange chamber 119 is exhausted, thereby making them to a high vacuum. In case the stem 115 is pulled attached to the optical window carriage 110, the state of the gate link 112 of the optical window carriage 110 and the gate plate 111 changes from the locking state[see: in FIG. 7C] to unlocking state[see: FIG. 7A]. That is, while the gate plate 111 is attached to the optical window carriage 110 by the restoring force of the carriage spring 114 connected between the optical window carriage 110 and the gate plate 111 and the pulling force of the stem 115, the optical window 105 is separated from the optical port 116 in the reaction chamber 101.

After the separation of the optical window 105 from the optical port 116 in the reaction chamber 101, the blurred optical window is replaced with the clean optical window, repeating the same process to the above-mentioned process.

Figure 8:
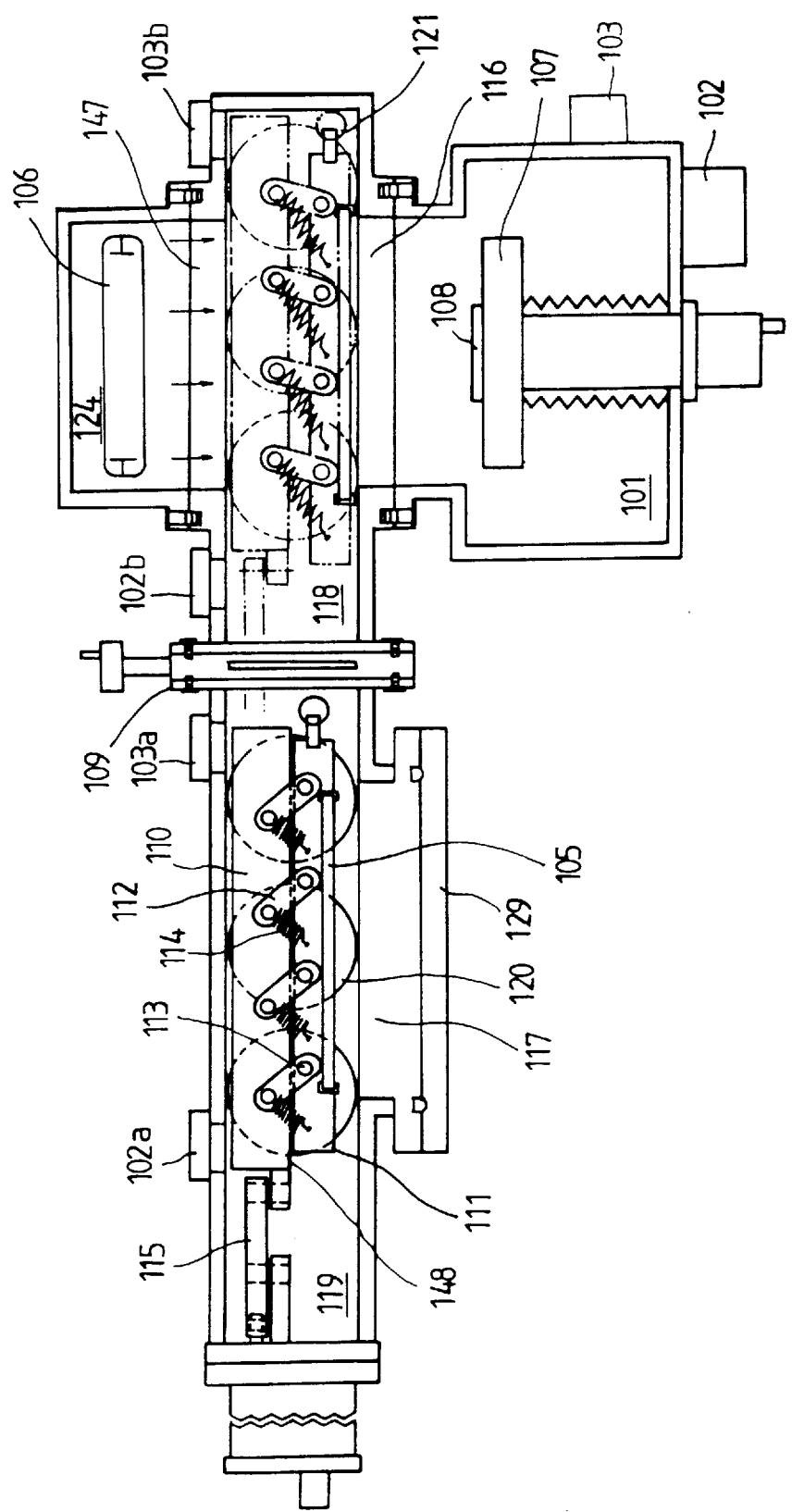
FIG. 8 is a sectional view illustrating a photo-CVD apparatus having exchange apparatus of optical window according to another preferred embodiment of the present invention.

FIG. 8 is a sectional view illustrating a photo-CVD apparatus having exchange apparatus of optical window according to another preferred embodiment of the present invention. In the photo-CVD apparatus in FIG. 8, the same reference numerals are used for the same parts to those of the photo-CVD apparatus in FIG. 4.

The photo-CVD apparatus as illustrated in FIG. 8 has the same construction as that, as illustrated in FIG. 4, except that a light source chamber 124 communicating with an optical window fixing chamber 118 and having a light source 106 therein is additionally provided onto the upper part of a light passing port 147 of the optical window fixing chamber 118 to place the light source 106 in the same circumstance with that of an optical window fixing chamber 118.

The photo-CVD apparatus according to the above-mentioned preferred embodiment of the present invention has advantages in that light energy emitted from the light source 106 can be efficiently used because a distance between the light source 106 and the substrate 108 in the reaction chamber 101 narrows, and optical transmittance into the reaction chamber 101 is increased by removal of a viewport 123 illustrated in FIG. 4 and formed between the light source 106 and the optical window fixing chamber 118.

Moreover, the photo-CVD apparatus illustrated in FIG. 4 has a drawback in that it is difficult to manufacture a large photo-CVD apparatus due to a pressure difference between upper and lower surfaces of the viewport 123 when the air of the optical window fixing chamber 118 is exhausted since one surface of the viewport 123 formed between the light source 106 and the optical window fixing chamber 118 is exposed to the air. However, according to the photo-CVD apparatus of a embodiment of the invention, thin film with large size can be deposited on a substrate 108 because the large-sized photo-CVD apparatus can be manufactured by placing the optical window fixing chamber 118 and the light source 106 in the light source chamber 124 in the same environment.

The detailed explanation for the operation of the photo-CVD apparatus as above is omitted since the operation of the photo-CVD apparatus is the same as that of the photo-CVD apparatus as illustrated in FIG. 4.

Figure 9:
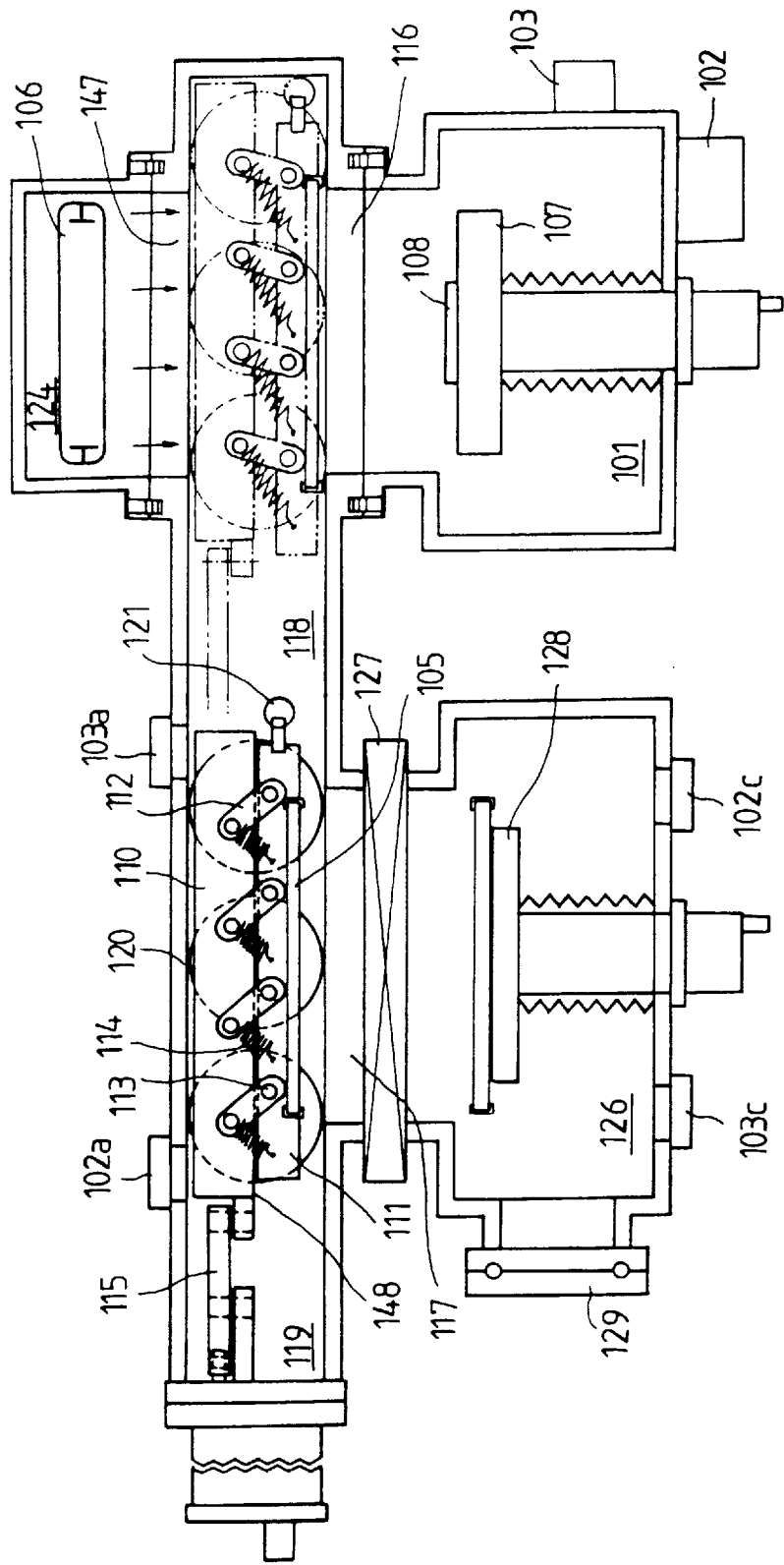
FIG. 9 is a sectional view illustrating a photo-CVD apparatus having exchange apparatus of optical window according to still another preferred embodiment of the present invention.

FIG. 9 is a sectional view illustrating a photo-CVD apparatus having exchange apparatus of optical window according to still another preferred embodiment of the present invention. In the photo-CVD apparatus in FIG. 9, the same reference numerals are used for the same parts to those of the photo-CVD apparatus in FIG. 8.

Referring to FIG. 9, the photo-CVD apparatus having exchange apparatus of an optical port comprises: a reaction chamber 101 for carrying out a deposition reaction, having a gas inlet 103, a gas outlet 102, a substrate heating holder 107, a heater, and an optical port 116 being formed thereon; an optical window fixing chamber 118 for being carried out detachment/attachment of an optical window 105 transferred by an optical window transferring means 148, being formed on an upper part of said reaction chamber 101, having a light passing port 147 being formed thereon; a light source chamber 124 for irradiating light having required energy for photo-CVD reaction into said reaction chamber 101, said light source chamber 124 being located on said light passing port 147 in said optical window fixing chamber 118 so as to communicate with said optical window fixing chamber 118; an optical window exchange chamber 119 for replacing the blurred optical window transferred by the optical window transferring means 148 with a clean optical window, said exchange chamber 119 transversely integrally extended from said optical window fixing chamber 118 and having a gas inlet 103a, a gas outlet 102a and a optical window exchange port 117 at the lower end thereof for replacing the optical window; an optical window load-lock chamber 126 being formed to communicate with said optical window exchange chamber 119 downwardly via said optical window exchange port 117 of optical window exchange chamber 119, having a gas inlet 103c, a gas outlet 102c, and a door 129 at one side thereof for replacing the optical window, and said load-lock chamber 126 having a lower-upper conveying means 126 of a optical window 105 for attaching or detaching the optical window 105 to or from the optical window transferring means 148; circular gate valve 127, which is one of the opening and shutting means, for communication said optical window exchange chamber 119 with said optical window load-lock chamber 126 or separating said optical window exchange chamber 119 from said optical window load-lock chamber 126, said opening and shutting means being located between said optical window exchange chamber 119 and said optical window load-lock chamber 126; an optical window transferring means 148, into which the optical window 105 is mounted by said lower-upper conveying means 128 of said optical window load-lock chamber 126, for transferring the optical window 105 by traversing between said optical window exchange chamber 119 and said optical window fixing chamber 118, and for detaching/attaching the optical window 105 on said optical port 116 of said reaction chamber 101; and, a stem, which is one of the driving means, for providing driving force to make said optical window transferring means 148 traverse between said optical window exchange chamber 119 and said optical window fixing chamber 118, said driving means being connected to said optical window transferring means 148.

The photo-CVD apparatus having exchange apparatus of optical window according to the present invention as illustrated in FIG. 9 has a configuration by which the operation of removing and mounting an optical window can be automatically carried out, to make exchange of the optical window easier.

Now, the operation of the photo-CVD apparatus having exchange apparatus of optical window according to the above embodiment will be described hereinafter.

After the blurred optical window 105 is removed from the optical window transferring means 148, the clean optical window 105 is mounted on the lower-upper conveying means of optical window 105, which is formed on the optical window load-lock chamber 126 and is composed of a carrying stand 128 which can move to an upper or lower direction, and the optical window load-lock chamber 126 is exhausted to a high vacuum. Then, the circular gate value 127 located between the optical window exchange chamber 119 and the optical window load-lock chamber 126 is opened, the optical window 105 is mounted into the gate plate 111 in the optical window transferring means 148 by lifting off the carrying stand 128 which is a lower-upper conveying means of optical window 105. And then, the carrying stand 128 is dropped, and the circular gate valve 127 is closed.

Thereafter, the clean optical window 105 is fixed to the optical port 116 in the reaction chamber 101 by carrying the optical window 105 to the optical window fixing chamber 118 in a same way as that of the aforementioned preferred embodiment of the invention. After the optical window 105 blurred by the photo-CVD process is again carried to the optical window exchange chamber 119, the optical window 105 is removed by opening the circular gate valve 127 and lifting off the carrying stand 128.

Next, the circular gate valve 127 is again closed, the optical window load-lock chamber 126 is maintained in an atmospheric pressure by flowing into the nitrogen and the inert gas into the inlet 103c of the optical window load-lock chamber 126, and the door 129 is opened, thereby removing the optical window 105.

The clean optical window 105 is again mounted to the carrying stand 128, and the optical window load-lock chamber 126 is fully cleaned three to four times by the nitrogen and the inert gas. The optical window load-lock chamber 126 is exhausted through the outlet 102c to a high vacuum, and the clean optical window 105 is mounted to the gate plate 111 of the optical window transferring means 148 according to the above-mentioned steps.

The photo-CVD apparatus having exchange apparatus of optical window according to the preferred embodiment of the present invention as illustrated in FIG. 9 has advantages in that it is possible to maintain semi-permanently the insides of the optical window exchange chamber 119 and the optical window fixing chamber 118 clean since the exposure of the optical window exchange chamber 119 and the optical window fixing chamber 118 to the air can be prevented by forming additionally the optical window load-lock chamber 126 in the photo-CVD apparatus of the present invention when removing or mounting the optical window 105, and it is possible to carry out exchanging of the optical window 105 easier since the removing and mounting of the optical window 105 can be automatically carried out.

Figure 10:
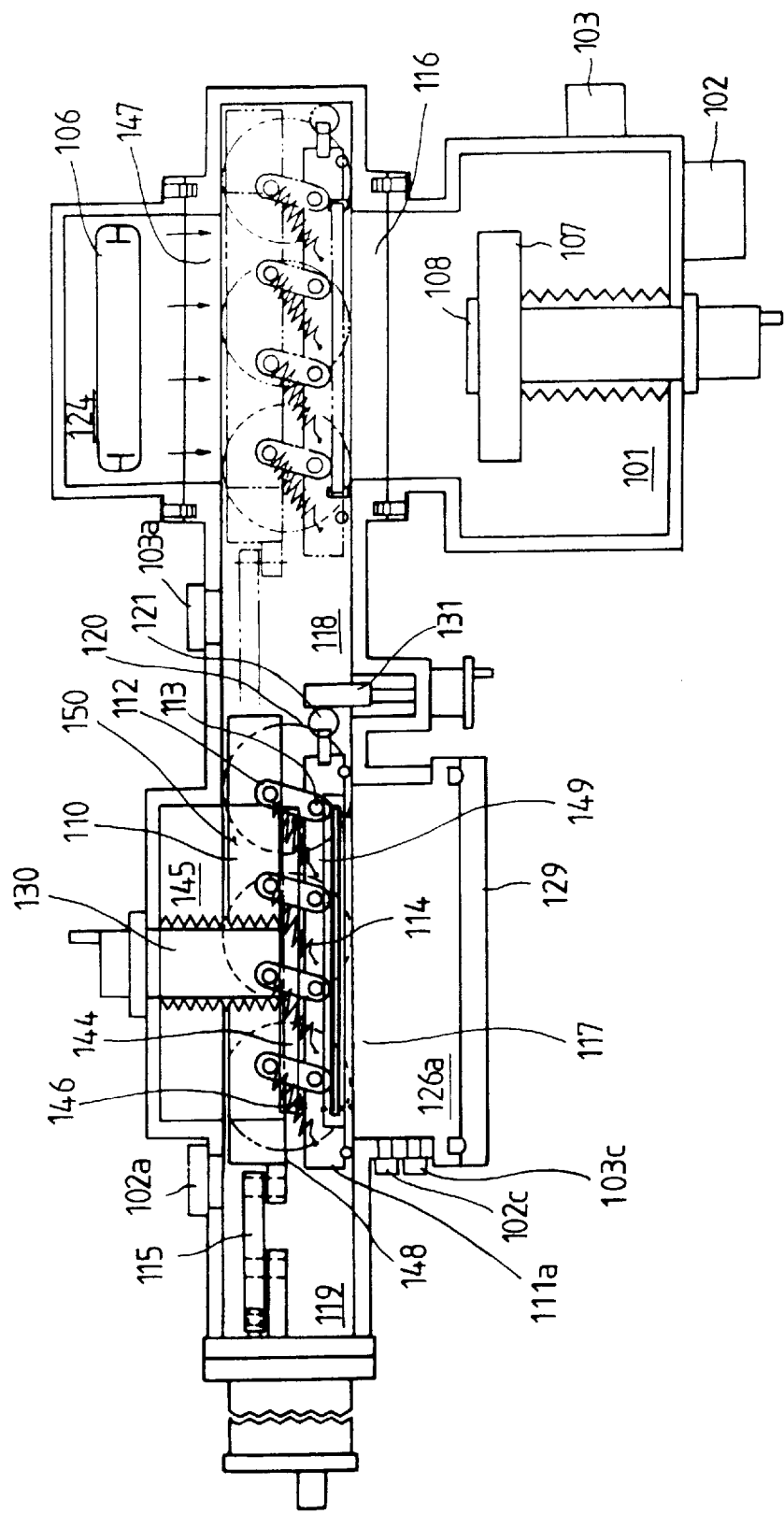
FIG. 10 is a sectional view illustrating a photo-CVD apparatus having exchange apparatus of optical window according to the other preferred embodiment of the present invention.

FIG. 10 is a sectional view illustrating a photo-CVD apparatus having exchange apparatus of optical window according to the other preferred embodiment of the present invention. In the photo-CVD apparatus in FIG. 10, the same reference numerals are used for the same parts to those of the photo-CVD apparatus in FIG. 9.

Referring to FIG. 10, the photo-CVD apparatus having exchange apparatus of an optical window comprises: a reaction chamber 101 for carrying out a deposition reaction, having a gas inlet 103, a gas outlet 102, a substrate heating holder 107, heater and an optical port 116 being formed thereon; an optical window fixing chamber 118 for being carried out detachment/attachment of an optical window 105 transferred by an optical window transferring means 148, being formed on an upper part of said reaction chamber 101, having a light passing port 147 being formed thereon; a light source chamber 124 for irradiating light having required energy for photo-CVD reaction into said reaction chamber 101, said light source chamber 124 being located on said light passing port 147 in said optical window fixing chamber 118 so as to communicate with said optical window fixing chamber 118; an optical window exchange chamber 119 for replacing the blurred optical window transferred by the optical window transferring means 148 with a clean optical window, said exchange chamber 119 transversely integrally extended from said optical window fixing chamber 118 and having a gas inlet 103a, a gas outlet 102a and a optical window exchange port 117 at the lower end thereof for replacing the optical window; an optical window load-lock chamber 126a being formed to communicate with said optical window exchange chamber 119 downwardly via said optical window exchange port 117 of optical window exchange chamber 119, having a gas inlet 103c, a gas outlet 102c, and a door 129 at the lower end thereof for replacing the optical window 105; an optical window transferring means 148, into which the optical window 105 is mounted, for transferring the optical window 105 by traversing between said optical window exchange chamber 119 and said optical window fixing chamber 118, and for detaching/attaching the optical window 105 on said optical port 116 of said reaction chamber 101, said optical window transferring means 148 including a gate plate 111a having a light passing passage 149 formed in the center thereof for passing a light emitted from the light source 106, said gate plate 111a having a fixing means for fixing the optical window, and said gate plate 111a having a gate plate horizontal position fixing means 121 for fixing horizontal position of the gate plate 111a by contacting a supporting means 131 for fixing gate plate horizontal position or by contacting one side wall of said optical window fixing chamber 118, an optical window carriage 110 for transferring said gate plate 111a transversely between said optical window exchange chamber 119 and the optical window fixing chamber 118, said carriage 110 being connected to a stem 115, which is a driving means, and located at an upper part of said gate plate 111a, having a light passing passage 150 in the center thereof for passing the light emitted from said light source 106, having a plurality of carriage wheels 120 attached to both sides thereof, and, a gate plate pressing means for lifting off or dropping said gate plate 111a, being composed of a gate plate link 112, a gate plate link pin 113 and a spring 114, said gate plate pressing means being connected to said gate plate 111a and said optical window carriage 110; a driving means 115 for providing driving force to make said optical window transferring means 148 traverse between said optical window exchange chamber 119 and said optical window fixing chamber 118, said driving means 115 being connected to said optical window transferring means 148; a storage chamber 145 for storing a gate plate vacuum sealing means, said gate plate vacuum sealing means for vacuum-sealing said light passing port 149 of said gate plate 111a by the downward movement being mounted to an upper part of said storage chamber 145, said gate plate vacuum sealing means including a circular plate 144 having a diameter smaller than that of said light passing port 150 in said optical window carriage 110 and larger than that of said light passing port 149 in said gate plate 111a and holding rod 130 for holding circular plate for moving said circular plate 144 up and down, one end of said holding rod 130 being attached to said circular plate 144; and, a supporting meas 131 for fixing gate plate horizontal position being formed at a lower part between said optical window fixing chamber 118 and said optical window exchange chamber 119, said supporting means 131 being provided to move downwardly and upwardly so as to support said gate plate horizontal position fixing means 121 by contacting therewith to the movement of said driving means 115, when said optical window transferring means 148 positioned at said optical window exchange chamber 119.

Figure 11:
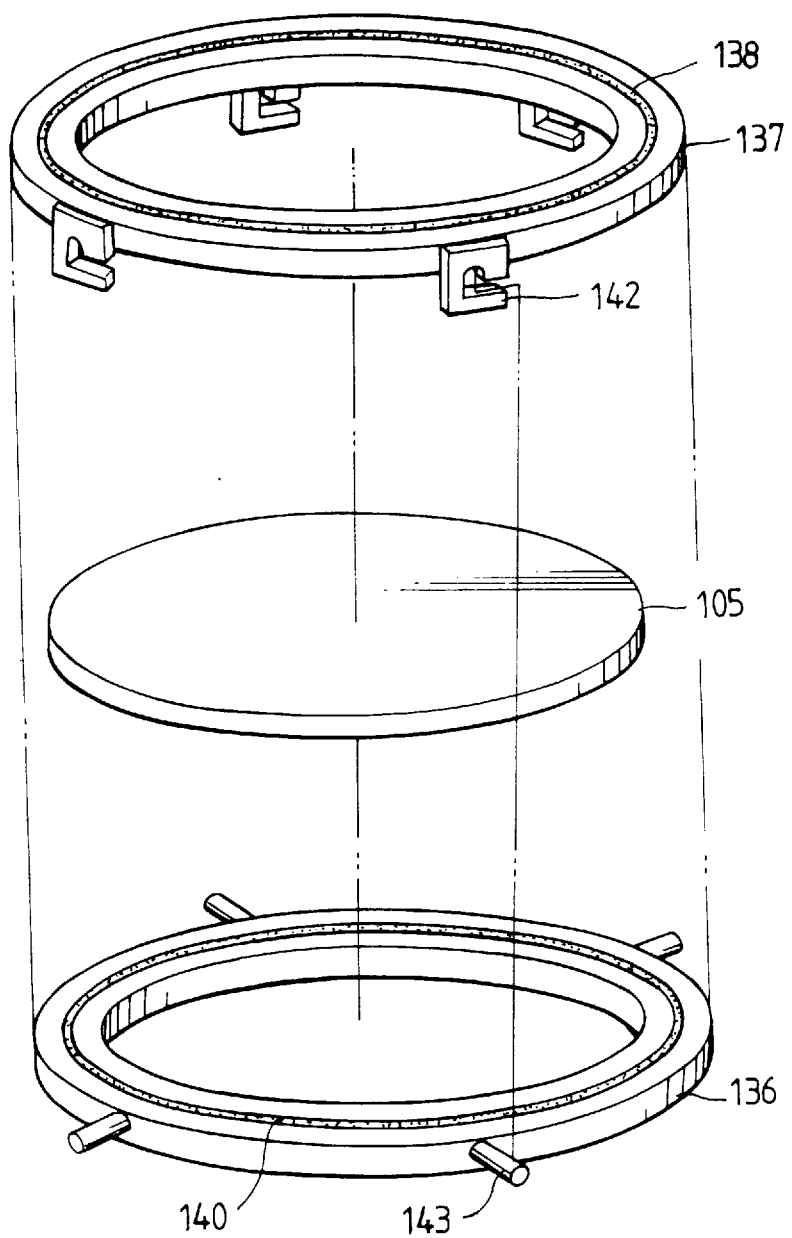
FIG. 11 is an exploded perspective view illustrating a cassette-type optical window fixing device for receiving an optical window when fixing the optical window to a gate plate in the preferred embodiment of the present invention as illustrated in FIG. 10.
Figure 12B:
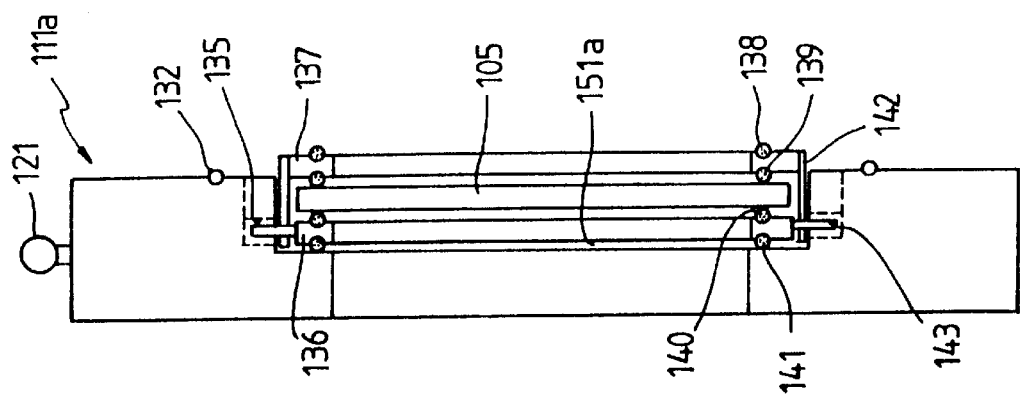
FIGS. 12A and 12B are a plan view and a side view respectively illustrating that the optical window is fixed to the gate plate by the cassette-type optical window fixing device illustrated in FIG. 11.
Figure 12A:
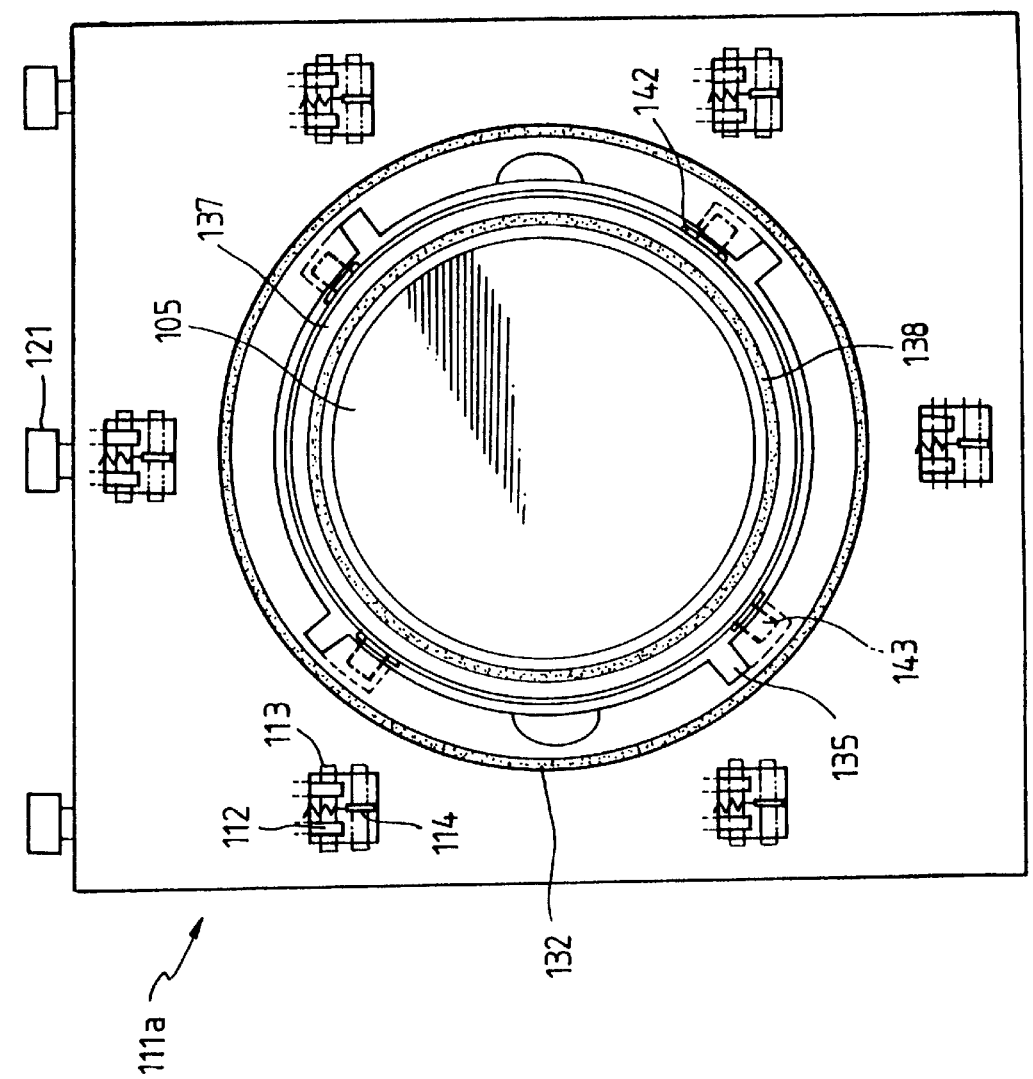

FIG. 11 is an exploded perspective view illustrating a cassette-type optical window fixing device for receiving an optical window when fixing the optical window 105 to a gate plate 111a in the preferred embodiment of the present invention, and FIGS. 12A and 12B are a plan view and a side view respectively illustrating that the optical window 105 is fixed to the gate plate 111a by the cassette-type optical window fixing device as illustrated in FIG. 11.

Referring to FIGS. 11 to 12A and 12B, the optical window fixing means formed in said gate plate 111a comprises: a cassette-type optical window fixing device 136, 137 composed of an upper plate 137 formed of a ring shape and having O-ring 138, 139, which is a vacuum sealing means, attached to the upper and the lower surfaces thereof respectively and a plurality of 142 links mounted to the sides thereof, and a lower plate 136 having a plurality of projections 143 connected to said links 142 of said upper plate 137, so as to receive the optical window 105 therebetween; and a circular groove 151a for fixing said cassette-type optical window fixing device 136, 137 to the gate plate 111a, said groove 151a being formed in the lower part of the gate plate 111a, having a plurality of grooves 135 for mounting the optical window fixing device in a L-shape so as to insert said projections 143 of said lower plate 136 of said optical window fixing device therein. The optical window fixing device may be applied to fix the optical window 105 to the gate plate 111 in the other embodiments of the present invention.

Now, the operation of the photo-CVD apparatus having exchange apparatus of optical window according to the above embodiment of the present invention will be described hereinafter.

Since the operations of transferring a clean optical window 105 to the optical window fixing chamber 118 and fixing the optical window 105 to the optical port 116 using the optical window transferring means 148 are the same as above, the detailed description of these operations are omitted.

By pulling the stem 115 connecting the optical window transferring means 148 to which optical window 105 blurred by the photo-CVD process is attached, optical window transferring means 148 are moved to the optical window exchange chamber 119. After lifting off the supporting means 131 for fixing gate plate horizontal position, when the stem 115 is pushed, the bearing 121, which is a gate plate horizontal position fixing means, formed in a side of the gate plate 111a contacts the supporting means 131 for fixing gate horizontal position. As a result, the gate plate 111a drops as illustrated in FIG. 7, whereby an O-type ring 132 [see: FIG. 12B] attached to the gate plate 111a to which the optical window 105 is seated onto the periphery outside the optical window exchange port 117.

However, it is difficult to maintain the vacuum sealing state of the optical window fixing chamber 118 and the optical window exchange chamber 119 by the O-rings 138, 139, 140 and 141 attached to the upper and the lower surfaces of the cassette-type optical window fixing device 136 and 137 when the optical window load-lock chamber 126a is maintained at a atmospheric pressure, since the diameter of the optical window exchange port 117 is larger than the external diameter of the cassette-type optical window fixing device 136 and 137. Accordingly, in order to replace the optical window 105 through the door 129 in the optical window load-lock chamber 126a, while maintaining the vacuum state of the optical window exchange chamber 118 and the optical window fixing chamber 119, the optical window exchange chamber 119 and the optical window fixing chamber 118 are to be separated from the optical window load-lock chamber 126a, by sealing light passing passage 149 formed in the gate plate 111a.

For this purpose, the gate plate vacuum sealing supporter 130 to which the circular plate 144 with the O-ring 146 formed is attached, is dropped through the light passing passage 150 in the optical window carriage 110, whereby the circular plate 144 seals vacuum-tight the light passing passage 149 in the gate plate 111a.

Thereafter, the air, nitrogen and inert gas flows through the inlet 103a, and the optical window load-lock chamber 126a is maintained in an atmospheric pressure. And then, the door 129 is opened, the blurred optical window is removed and replaced with clean one.

At this time, to replace with the clean optical window 105, as illustrated in FIG. 11, the optical window 105 is placed on the lower plate 136 of the optical window fixing device, and the upper plate 137 of the optical window fixing device is positioned onto the optical window 105. The projections 143 on the lower plate 136 of the optical window fixing device are inserted into the links 142 of the upper plate 137 of the optical window fixing device, then the optical window fixing device upper plate 137 is rotated slightly, thereby fixing the optical window 105 to the cassette-type optical window fixing device 136 and 137. After that, the projections 143 on the lower plate 136 of the cassette-type optical window fixing device by which the optical window 105 is received are pushed into an L-type groove 135 which is formed in the circular groove 151a of the gate plate 111a, and rotated slightly, thereby fixing the cassette-type optical window fixing device 136 and 137 to the gate plate 111a as illustrated in FIG. 12.

When the exchanging step of the optical window 105 is finished according to the aforementioned steps, the inhalation and the exhausting process are carried out three or four times in the optical window load-lock chamber 126a which had been exposed to the air, using the nitrogen or the inert gas, and the optical window load-lock chamber 126a is exhausted to a vacuum through the gas outlet 102c.

Thereafter, the gate plate vacuum sealing supporter 130 and the circular plate 144 are stored in the storage 145 by lifting the gate plate vacuum sealing supporter 130, and the gate plate 111a is returned to the unlocking state by pulling the stem 115, and the supporting means for fixing the gate plate horizontal position 131 is dropped. After that, the optical window transferring means 148 into which the cassette-type optical window 105 is mounted is transferred to the optical window fixing chamber 118, and the photo-CVD process is carried out according to the same process as the aforementioned process.

Although, in the preferred embodiments of the present invention as illustrated in FIGS. 9 and 10, it has been described that the light source 106 is disposed in the light source chamber 124 in a separate way, it is also possible in the present invention to locate the light source 106 so as to irradiate the light having a required energy for the photo-CVD reaction into the reaction chamber 101 through the viewport 123 mounted on the light passing port 147 in the optical window fixing chamber 118, without additionally forming the light source chamber 124, as illustrated in FIG. 4.

In the photo-CVD apparatus having exchange apparatus of an optical window according to the present invention as above, an optical window blurred by adherence of reaction products and reaction gas during a deposition process by the photo-CVD apparatus can be replaced with a clean optical window in a mechanical manner without exposing the inside of a reaction chamber to the air semipermanently.

Additionally, In the photo-CVD apparatus having exchange apparatus of an optical window according to the present invention, it is possible to maintain the clean state of the reaction chamber since dust can not be generated, to maintain the vacuum sealing state between the optical window and the reaction chamber efficiently, to prevent the pollution of the reaction chamber resulted from additional etching gas and to prevent bad influence on the reaction chamber by the reaction gas.

Moreover, in the photo-CVD apparatus having exchange apparatus of an optical window according to the present invention, since the optical window is positioned in the inside of the photo-CVD apparatus and the pressure between the upper and lower surfaces of the optical window is maintained evenly, the optical window with thin thickness can be applied, thereby decreasing the absorption loss of the light energy emitted from the light source by the optical window and manufacturing the large photo-CVD apparatus which can deposit thin film of large area.

Further, according to the method of exchanging optical window of the present invention, the optical window blurred by the adherence of reaction products and the reaction gas during the deposition process by the photo-CVD apparatus can be simply replaced with the clean optical window without exposing the inside the reaction chamber to the air semipermanently.

In addition, by the method of exchanging optical window according to the preferred embodiment of the present invention, the optical window blurred by the attachment of the reaction product and the reaction gas during the deposition process by the photo-CVD apparatus can be easily replaced into the clean optical window without exposing the inside the reaction chamber to the air semi-permanently.

On the other hand, it will be apparent to those skilled in the art on reference to this description that the photo-CVD apparatus having exchange apparatus of an optical window and method of exchanging an optical window according to the preferred embodiments of the present invention will be effectively applied to replace an optical window blurred by the attachment of the materials produced by dissociation of the reaction gas in the reaction chamber or the materials used for deposition or growth with the clean optical window in a lamp-heating type thermal chemical vapor deposition apparatus which utilizes the light energy as heat source, a photo-excited etching apparatus and all the vapor deposition apparatus or growth apparatus having the optical window in a broad sense, as well as the photo-CVD apparatus.

As described above, according to the photo-CVD apparatus having exchange apparatus of an optical window and the method of exchanging an optical window of the present invention, an optical window blurred by adherence of reaction products and reaction gas during a deposition process by the photo-CVD apparatus can be replaced with a clean optical window in a mechanical manner without exposing the inside of a reaction chamber to the air semipermanently and it is possible to maintain the clean state of the reaction chamber since dust can not be generated, to maintain the vacuum sealing state between the optical window and the reaction chamber efficiently, to prevent the pollution of the reaction chamber resulted from additional etching gas and to prevent bad influence on the reaction chamber by the reaction gas, and to be utilized in an efficient manner to deposit a thin film on the substrate with large surface area.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A photo-CVD apparatus having exchange apparatus of an optical window comprising:

a reaction chamber for carrying out a deposition reaction having a gas inlet, a gas outlet, a substrate heating holder, heater, and an optical port being formed thereon;

an optical window fixing chamber for being carried out detachment/attachment of an optical window transferred by an optical window transferring means, being formed on an upper part of said reaction chamber, having a gas inlet and a gas outlet and a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a door at the lower end thereof for replacing the optical window;

an opening and shutting means for communicating said optical window fixing chamber with said optical window exchange chamber or separating said optical window fixing chamber from said optical window exchange chamber, said opening and shutting means being located between said optical window fixing chamber and said optical window exchange chamber;

an optical window transferring means, into which the optical window is mounted, for transferring the optical window by traversing between said optical window exchange chamber and said optical window fixing chamber, and for detaching/attaching the optical window on said optical port of said reaction chamber; and a driving means for providing driving force to make said optical window transferring means traverse between said optical window exchange chamber and said optical window fixing chamber, said driving means being connected to said optical window transferring means.

2. The photo-CVD apparatus having exchange apparatus of an optical window according to claim 1, wherein a light source chamber communicating with said optical window fixing chamber and having a light source therein is additionally provided onto an upper part of said light passing port of said optical window fixing chamber.

3. The photo-CVD apparatus having exchange apparatus of an optical window of claim 1, wherein said optical window transferring means includes:

a gate plate having a light passing passage formed in the center thereof for passing a light emitted from the light source, said gate plate having a fixing means for fixing the optical window, and said gate plate having a gate plate horizontal position fixing means for fixing horizontal position of the gate plate by contacting one side wall of said optical window fixing chamber;

an optical window carriage for transferring said gate plate transversely between the optical window exchange chamber and the optical window fixing chamber, said carriage being connected to said driving means and located at an upper part of said gate plate, having a light passing passage in the center thereof for passing the light emitted from the light source, having a plurality of carriage wheels attached to both sides thereof; and a gate plate pressing means for pressing the optical window fixed to said gate plate onto the outer peripheral edge of said optical port in the reaction chamber or separating the optical window from said optical port in said reaction chamber by lifting off or dropping said gate plate, said gate plate pressing means being connected to said gate plate and said optical window carriage.

4. The photo-CVD apparatus having exchange apparatus of an optical window of claim 3, wherein said optical window fixing means of the gate plate is comprised of: a circular groove for fixing the optical window, said groove being formed into a lower part of said gate plate; and a plurality of optical window fixing spring for pressing the optical window, to the edge of which a vacuum sealing means is attached, to the central axis, said fixing springs being formed to the side wall of said circular groove.

5. The photo-CVD apparatus having exchange apparatus of an optical window of claim 3, wherein said optical window fixing means of the gate plate is comprised of: a cassette-type optical window fixing device composed of an upper plate formed of a ring shape and having a vacuum sealing means attached to the upper and the lower surfaces thereof respectively and a plurality of links mounted to the sides thereof, and a lower plate having a plurality of projections connected to said links of said upper plate, so as to receive the optical window therebetween; and a circular groove for fixing said cassette-type optical window fixing device to the gate plate, said groove being formed in the lower part of the gate plate, having a plurality of grooves for mounting the optical window fixing device so as to insert said projections of said lower plate of said optical window fixing device therein.

6. A photo-CVD apparatus having exchange apparatus of an optical window comprising:

a reaction chamber for carrying out a deposition reaction, having a gas inlet, a gas outlet, a substrate heating holder, a heater, and an optical port being formed thereon;

an optical window fixing chamber for being carried out detachment/attachment of an optical window transferred by an optical window transferring means, being formed on an upper part of said reaction chamber, having a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a optical window exchange port at the lower end thereof for replacing the optical window;

an optical window load-lock chamber being formed to communicate with said optical window exchange chamber downwardly via said optical window exchange port of optical window exchange chamber, having a gas inlet, a gas outlet, and a door at one side thereof for replacing the optical window, and said load-lock chamber having a lower-upper conveying means of a optical window for attaching or detaching the optical window to or from the optical window transferring means;

an opening and shutting means for communication said optical window exchange chamber with said optical window load-lock chamber or separating said optical window exchange chamber from said optical window load-lock chamber, said opening and shutting means being located between said optical window exchange chamber and said optical window load-lock chamber;

an optical window transferring means, into which the optical window is mounted by said lower-upper conveying means of said optical window load-lock chamber, for transferring the optical window by traversing between said optical window exchange chamber and said optical window fixing chamber, and for detaching/attaching the optical window on said optical port of said reaction chamber; and a driving means for providing driving force to make said optical window transferring means traverse between said optical window exchange chamber and said optical window fixing chamber, said driving means being connected to said optical window transferring means.

7. The photo-CVD apparatus having exchange apparatus of an optical window according to claim 6, wherein a light source chamber communicating with said optical window fixing chamber and having a light source therein is additionally provided onto an upper part of said light passing port of said optical window fixing chamber.

8. A photo-CVD apparatus having exchange apparatus of an optical window comprising:

a reaction chamber for carrying out a deposition reaction, having a gas inlet, a gas outlet, a substrate heating holder, heater and an optical port being formed thereon;

an optical window fixing chamber for being carried out detachment/attachment of an optical window transferred by an optical window transferring means, being formed on an upper part of said reaction chamber, having a light passing port being formed thereon;

a light source for irradiating light having required energy for photo-CVD reaction into said reaction chamber through a viewport mounted on said light passing port, said light source being located on said light passing port in said optical window fixing chamber;

an optical window exchange chamber for replacing the blurred optical window transferred by the optical window transferring means with a clean optical window, said exchange chamber transversely integrally extended from said optical window fixing chamber and having a gas inlet, a gas outlet and a optical window exchange port at the lower end thereof for replacing the optical window;

an optical window load-lock chamber being formed to communicate with said optical window exchange chamber downwardly via said optical window exchange port of optical window exchange chamber, having a gas inlet, a gas outlet, and a door at the lower end thereof for replacing the optical window;

an optical window transferring means, into which the optical window is mounted, for transferring the optical window by traversing between said optical window exchange chamber and said optical window fixing chamber, and for detaching/attaching the optical window on said optical port of said reaction chamber, said optical window transferring means including:

a gate plate having a light passing passage formed in the center thereof for passing a light emitted from the light source, said gate plate having a fixing means for fixing the optical window, and said gate plate having a gate plate horizontal position fixing means for fixing horizontal position of the gate plate by contacting a supporting means for fixing gate plate horizontal position or by contacting one side wall of said optical window fixing chamber;

an optical window carriage for transferring said gate plate transversely between said optical window exchange chamber and the optical window fixing chamber, said carriage being connected to a driving means and located at an upper part of said gate plate, having a light passing passage in the center thereof for passing the light emitted from said light source, having a plurality of carriage wheels attached to both sides thereof; and, a gate plate pressing means for lifting off or dropping said gate plate, said gate plate pressing means being connected to said gate plate and said optical window carriage;

a driving means for providing driving force to make said optical window transferring means traverse between said optical window exchange chamber and said optical window fixing chamber, said driving means being connected to said optical window transferring means;

a storage chamber for storing a gate plate vacuum sealing means, said gate plate vacuum sealing means for vacuum-sealing said light passing port of said gate plate by the downward movement being mounted to an upper part of said storage chamber, said gate plate vacuum sealing means including a circular plate having a diameter smaller than that of said light passing port in said optical window carriage and larger than that of said light passing port in said gate plate and holding rod for holding said circular plate for moving said circular plate up and down, one end of said holding rod being attached to said circular plate; and a supporting meas for fixing gate plate horizontal position being formed at a lower part between said optical window fixing chamber and said optical window exchange chamber, said supporting means being provided to move downwardly and upwardly so as to support said gate plate horizontal position fixing means by contacting therewith to the movement of said driving means, when said optical window transferring means positioned at said optical window exchange chamber.

9. The photo-CVD apparatus having exchange apparatus of an optical window according to claim 8, wherein a light source chamber communicating with said optical window fixing chamber and having a light source therein is additionally provided onto an upper part of said light passing port of said optical window fixing chamber.

10. A method of exchanging an optical window in photo-CVD apparatus, comprising the following steps of:

exhausting the air of a reaction chamber, an optical window fixing chamber and an optical window exchange chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

separating said optical window fixing chamber from said optical window exchange chamber by an opening and shutting means;

maintaining said isolated optical window exchange chamber to a atmospheric pressure;

opening a door of said optical window exchange chamber and replacing said blurred optical window with a clean one;

closing said door and exhausting the air of said optical window exchange chamber to a high vacuum;

opening said opening and shutting means and transferring said clean optical window to said optical window fixing chamber by said optical window transferring means; and moving said optical window downwardly and mounting said optical window onto said reaction chamber.

11. A method of exchanging an optical window in photo-CVD apparatus, comprising the following steps of:

exhausting the air of a reaction chamber, an optical window fixing chamber, an optical window exchange chamber and an optical window load-lock chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

opening an opening and shutting means and collecting said blurred optical window by lifting off an optical window lower-upper conveying means;

separating said optical window fixing chamber and said optical window exchange chamber from said optical window load-lock chamber by said opening and shutting means;

maintaining said isolated optical window load-lock chamber to a atmospheric pressure;

removing said blurred optical window after opening a door of said load-lock chamber and mounting a clean optical window on said optical window lower-upper conveying means;

closing said door and exhausting the air of said optical window load-lock chamber to a high vacuum;

opening said opening and shutting means and mounting the optical window into said optical window transferring means by lifting off said optical window lower-upper conveying means;

dropping said optical window lower-upper conveying means and closing said opening and shutting means;

transferring said clean optical window to said optical window fixing chamber by said optical window transferring means; and moving said optical window downwardly and mounting said optical window onto said reaction chamber.

12. A method of exchanging an optical window in photo-CVD apparatus, comprising the following steps of:

exhausting the air of a reaction chamber, an optical window fixing chamber, an optical window exchange chamber, a storage chamber and an optical window load-lock chamber, thereby making them in a high vacuum state;

separating an optical window blurred by the attachment of reaction products and a reaction gas during a deposition process by a photo-CVD apparatus from said reaction chamber and transferring the optical window to said optical window exchange chamber with an optical window transferring means;

lifting off a supporting meas for fixing gate plate horizontal position, pushing a driving means, and adhering a gate plate of a optical window transferring means closely to the edge of an optical window exchange port of a optical window transferring means;

separating said optical window fixing chamber, said optical window exchange chamber and said storing chamber from said optical window load-lock chamber by dropping a gate plate vacuum sealing means through a light passing port formed at an optical window carriage of said optical window transferring means;

maintaining said isolated optical window load-lock chamber to a atmospheric pressure;

opening a door of said load-lock chamber and replacing a blurred optical window with clean one;

closing said door and exhausting the air of said optical window load-lock chamber to a high vacuum;

storing said gate plate vacuum sealing means in a storage chamber by lifting off said gate plate vacuum sealing means;

returning said gate plate of said optical window transferring means to a releasing state by pulling said driving means and dropping said supporting meas for fixing gate plate horizontal position;

transferring said clean optical window to said optical window fixing chamber by said optical window transferring means; and moving said optical window downwardly and mounting said optical window onto said reaction chamber.

* * * * *